(12) United States Patent
Kaneko et al.

(10) Patent No.: US 7,187,702 B2
(45) Date of Patent: Mar. 6, 2007

(54) SURFACE-EMITTING LIGHT EMITTING DEVICE, MANUFACTURING METHOD FOR THE SAME, OPTICAL MODULE, AND OPTICAL TRANSMISSION APPARATUS

(75) Inventors: Tsuyoshi Kaneko, Shimosuwa-machi (JP); Satoshi Kito, Suwa (JP); Tetsuo Hiramatsu, Chino (JP)

(73) Assignee: Seiko Epson Corporation, Tokyo (JP)

( * ) Notice: Subject to any disclaimer, the term of this patent is extended or adjusted under 35 U.S.C. 154(b) by 135 days.

(21) Appl. No.: 10/660,629

(22) Filed: Sep. 12, 2003

(65) Prior Publication Data

US 2004/0120379 A1 Jun. 24, 2004

(30) Foreign Application Priority Data

Sep. 25, 2002 (JP) ............................. 2002-279065

(51) Int. Cl.
*H01S 5/00* (2006.01)
(52) U.S. Cl. ............................. 372/50.23; 372/50.124; 372/101; 372/106
(58) Field of Classification Search ............. 372/50.23, 372/50.124, 101, 106, 50.11
See application file for complete search history.

(56) References Cited

U.S. PATENT DOCUMENTS

| | | | |
|---|---|---|---|
| 4,706,101 A * | 11/1987 | Nakamura et al. ............. | 257/97 |
| 5,701,321 A | 12/1997 | Hayafuji et al. | |
| 6,154,479 A * | 11/2000 | Yoshikawa et al. ........... | 372/96 |
| 6,759,803 B2 | 7/2004 | Sorg | |
| 6,775,310 B2 * | 8/2004 | Sai et al. ........................ | 372/45 |
| 6,782,027 B2 * | 8/2004 | Cox et al. ................... | 372/50.1 |
| 2002/0044582 A1 | 4/2002 | Kondo | |

FOREIGN PATENT DOCUMENTS

| JP | 55-86175 | | 6/1980 |
|---|---|---|---|
| JP | A 62-198174 | | 9/1987 |
| JP | 63-7674 | | 1/1988 |
| JP | 0063007674 A | * | 1/1988 |
| JP | A 64-084758 | | 3/1989 |
| JP | 4-192290 | | 7/1992 |
| JP | A 4-297023 | | 10/1992 |
| JP | 6-151972 | | 5/1994 |
| JP | 0006151972 A | * | 5/1994 |
| JP | A 07-153979 | | 6/1995 |
| JP | 11-191636 | | 7/1999 |
| JP | 2000-76682 | | 3/2000 |
| JP | 2000067449 A | * | 3/2000 |
| JP | 2000076682 A | * | 3/2000 |
| JP | A 2000-067449 | | 3/2000 |
| JP | 2001-13377 | | 1/2001 |

(Continued)

*Primary Examiner*—Minsun Oh Harvey
*Assistant Examiner*—Tod T. Van Roy
(74) *Attorney, Agent, or Firm*—Oliff & Berridge, PLC

(57) ABSTRACT

To provide a surface-emitting light emitting device including an optical member whose mounting position, form, and size have been favorably controlled, and a method of manufacturing the same, as well as an optical module and an optical transmission apparatus that include this surface-emitting light emitting device, the surface-emitting light emitting device of the present invention can emit light perpendicular to a substrate and includes an emitting surface that emits the light, a base member that is provided on the emitting surface, and an optical member that is provided on an upper surface of the base member.

24 Claims, 19 Drawing Sheets

FOREIGN PATENT DOCUMENTS

| | | |
|---|---|---|
| JP | A 2001-066299 | 3/2001 |
| JP | 2001-156396 | 6/2001 |
| JP | 2001-284725 | 10/2001 |
| JP | 2001284725 A * | 10/2001 |
| JP | A 2000-101185 | 4/2002 |
| JP | A 2002-169004 | 6/2002 |
| JP | A 2002-331532 | 11/2002 |
| JP | 2004-119583 | 4/2004 |
| WO | WO 97/40558 | 10/1997 |

\* cited by examiner

FIG. 2
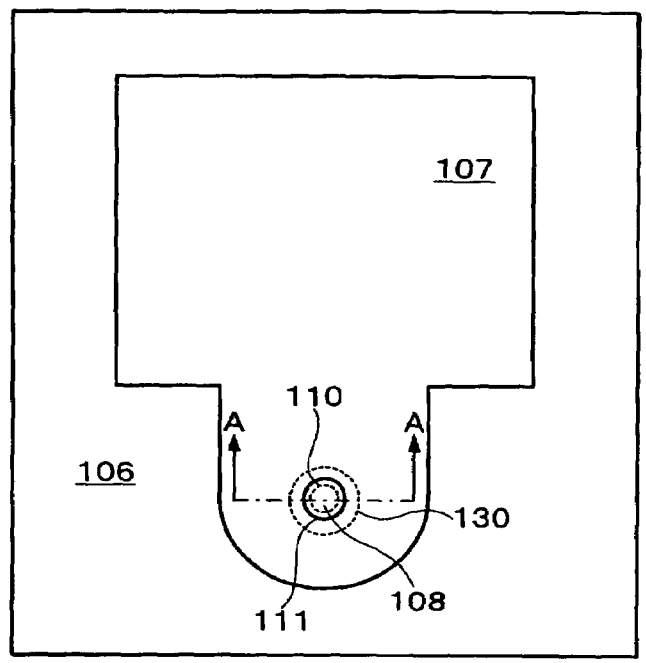
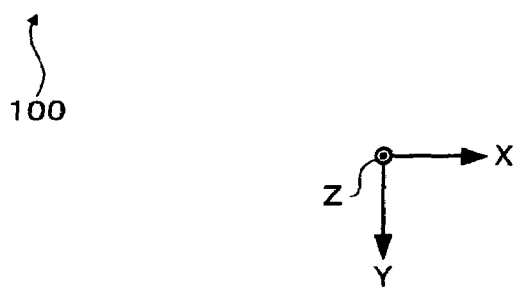
FIG. 3
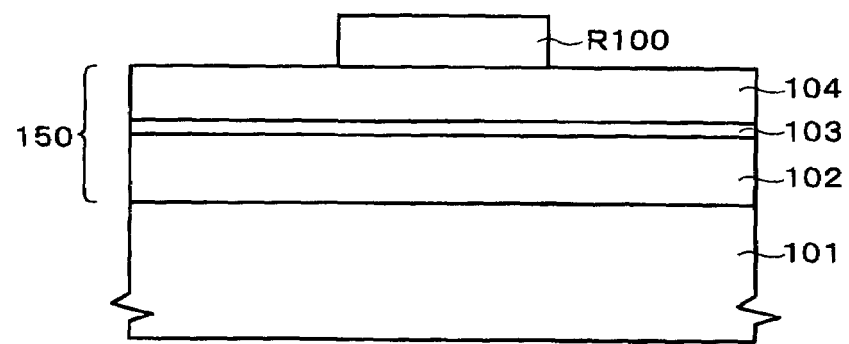

F I G. 1 2
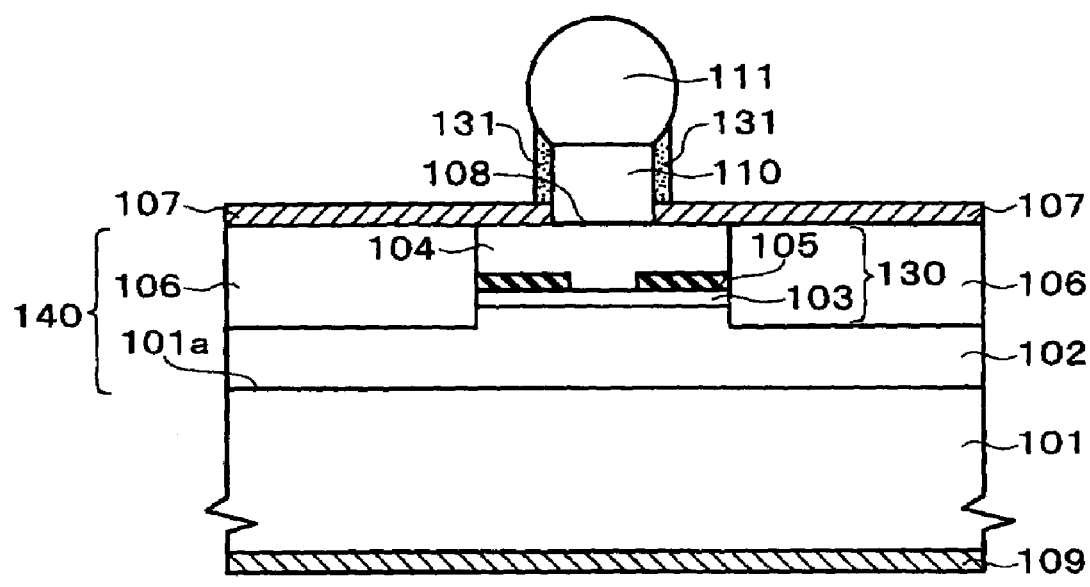

FIG. 21
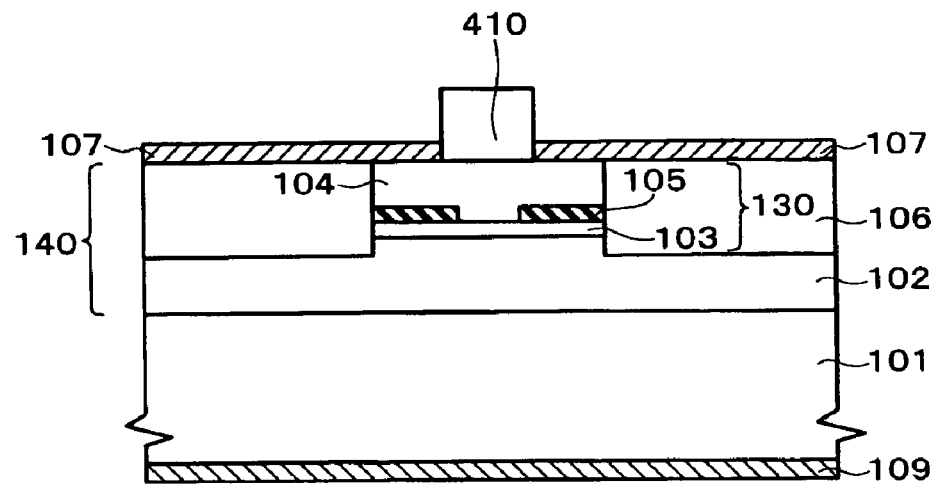
FIG. 22
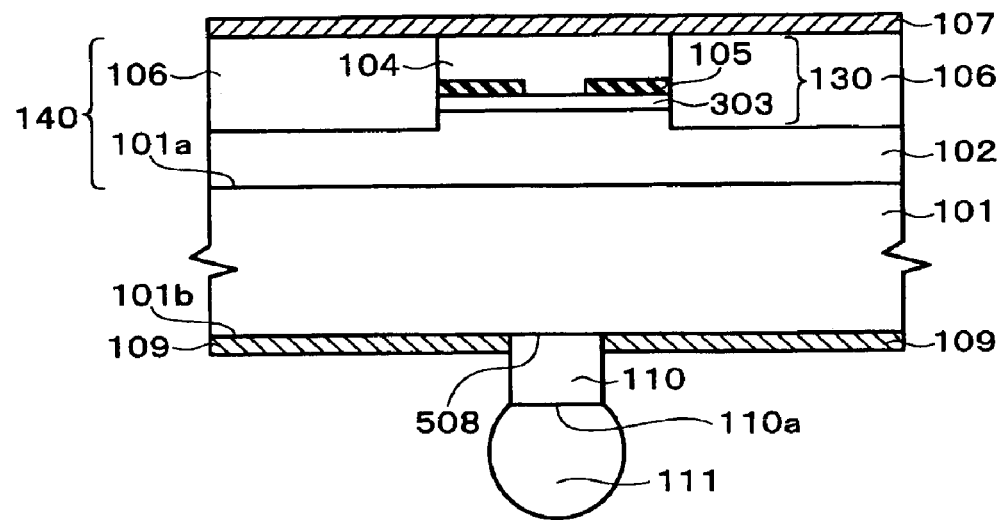
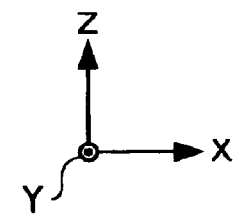

SURFACE-EMITTING LIGHT EMITTING DEVICE, MANUFACTURING METHOD FOR THE SAME, OPTICAL MODULE, AND OPTICAL TRANSMISSION APPARATUS

BACKGROUND OF THE INVENTION

1. Field of Invention

The present invention relates to a surface-emitting light emitting device and a manufacturing method for the same, and also to an optical module and an optical transmission apparatus that include such a surface-emitting light emitting device.

2. Description of Related Art

There are high expectations for surface-emitting light emitting devices, as represented by surface-emitting semiconductor lasers, as light sources for optical communication, optical computation, and various kinds of sensors. When using such devices, in some cases it is necessary to control the optical characteristics of the emitted light, such as the radiation angle and wavelength of the light. As one example, the optical characteristics can be controlled by mounting a predetermined optical member. In this case, it is important to control the mounting position, form, and size of the optical member in order to determine the characteristics of the light that is emitted.

As one example, a surface-emitting light emitting device in which a lens is mounted has been disclosed in Japanese Unexamined Patent Application Publication No. 2000-67449.

SUMMARY OF THE INVENTION

The present invention provides a surface-emitting light emitting device that includes an optical member whose mounting position, form, and size are controlled, and a manufacturing method for the same.

The present invention also provides an optical module and an optical transmission apparatus that include the surface-emitting light emitting device.

Surface-Emitting Light Emitting Device

A surface-emitting light emitting device capable of emitting light in a direction perpendicular to a substrate, includes: an emitting surface that emits the light; a base member that is provided on the emitting surface; and an optical member that is provided on an upper surface of the base member.

Here, the "substrate" refers to a substrate on which the light emitting device is formed. In the case of a surface-emitting semiconductor laser, for example, the "substrate" may be a semiconductor substrate, while in the case of a semiconductor light emitting diode, for example, the "substrate" may be a sapphire substrate, and in the case of an electroluminescent (EL) element, the "substrate" may be a transparent substrate.

In addition, a "base member" refers to a member that has an upper surface on which the optical member can be mounted, with the "upper surface of the base member" being the surface on which the optical member is mounted. The upper surface of the base member may be a flat surface or a curved surface, so long as the optical member can be mounted.

In addition, the "optical member" refers to a member with a function for changing the optical characteristics and/or direction of the emitted light from the light emitting device, with wavelength, deflection, radiation angle, and the like being examples of the "optical characteristics" referred to here. A lens and a polarizer can be given as examples of optical members.

According to the surface-emitting light emitting device of the present invention, in the above construction, by controlling the form and height, etc., of the upper surface of the base member, it is possible to obtain a surface-emitting light emitting device that includes an optical member whose mounting position, form and size have been favorably controlled. This is described in detail in the exemplary embodiments described below.

The surface-emitting light emitting device of the present invention can have the following aspects (1) to (13).

(1) The base member may be made of a material that transmits light of a predetermined wavelength. Here, "transmits" refers to the emitting of light from the base member after light that enters the base member has entered the base member, and includes not only a case where all of the light that enters the base member is emitted from the base member, but also a case where only part of the light that has entered the base member is emitted from the base member.

(2) The optical member may function as a lens or a polarizer.

(3) The optical member may be in the form of a sphere or an oval sphere.

(4) The optical member may be in the form of a truncated sphere or a truncated oval sphere. Here, a "truncated sphere" refers to the form obtained when a sphere is cut across a flat plane, and includes a form that is not perfectly spherical, but which resembles a sphere. A "truncated oval sphere" refers to the form obtained when an oval sphere is cut across a flat plane, and includes a form that is not a perfect oval sphere, but which resembles an oval sphere.

In this case, the cross-section of the optical member can be a circle or an oval. Also, in this case, the optical member can be made to function as a lens or a polarizer.

(5) The optical member may be formed by hardening a liquid material, which is capable of hardening, by applying energy.

In this case, the optical member may be formed from ultraviolet (UV) curing resin.

(6) A sealing member may be formed so as to cover at least part of the optical member. By doing so, it is possible to reliably fix the optical member onto the upper surface of the base member.

(7) The upper surface of the base member may be circular or oval.

(8) The upper surface of the base member may be a curved surface.

(9) The angle made between the upper surface of the base member and a surface on a side part of the base member that contacts the upper surface may be an acute angle. By using this construction, when a droplet is discharged to form an optical member precursor, which is then hardened to form the optical member, the side surfaces of the base member can be prevented from becoming wet due to the droplet. As a result, an optical member of the desired form and size can be reliably formed.

In this case, an upper part of the base member can be formed in an inversely tapered shape. Here, the "upper part of the base member" refers to a region of the base member near the upper surface. With this construction, when a droplet is discharged to form an optical member precursor, which is then hardened to form the optical member, the stability of the base member can be maintained and the angle made between the upper surface and side surface of the base member can be reduced. By doing so, it is possible to reliably prevent the side surface of the base member from becoming wet due to the droplet. As a result, an optical member of the desired form and size can be obtained.

(10) The surface-emitting light emitting device may be a surface-emitting semiconductor laser. In this case, the following aspects (I) to (III) can be used, for example.

(I) The substrate may be a semiconductor substrate, and the surface emitting semiconductor laser may be formed on the semiconductor substrate, may include a resonator at least part of which includes a pillar portion, and may have the emitting surface provided on an upper surface of the pillar portion.

In this case, the base member can be integrated with the pillar portion. Also, in this case, the base member can be formed from a semiconductor layer. In addition, the pillar portion can be made to function as the base member.

(II) The substrate may be a semiconductor substrate, and the semiconductor laser may include a resonator formed on the semiconductor substrate and may have the emitting surface provided on a rear surface of the semiconductor substrate.

(III) The substrate may be a semiconductor substrate, the semiconductor laser may include a resonator formed on the semiconductor substrate and may have a concave part formed in a rear surface of the semiconductor substrate. A light path adjusting layer may be formed by being buried in the concave part, and the emitting surface may be provided on the upper surface of the light path adjusting layer.

(11) The surface-emitting light emitting device may be a semiconductor light emitting diode.

In this case, the substrate may be a semiconductor substrate, the semiconductor light emitting diode may include a light emitting element that is formed on the semiconductor substrate and a pillar portion that includes an active layer that composes at least part of the light emitting element, and the emitting surface may be provided on an upper surface of the pillar portion.

Also, in this case, the base member can be integrally formed with the pillar portion. In addition, the base member can be composed of a semiconductor layer. Also, in this case, the pillar portion can have a function as the base member.

(12) The surface-emitting light emitting device may be an EL element.

(13) The optical member may function as a lens and be in the form of a truncated sphere, the refractive index of the optical member may be approximately equal to the refractive index of the base member, and the radius of curvature "r" of the optical member and the distance "d" from the emitting surface to the highest point of the optical member may satisfy Equation (1) below.

$$r \leq 0.34 * d \quad (1)$$

Method of Manufacturing a Surface-Emitting Light Emitting Device

The method of manufacturing a surface-emitting light emitting device is a method of manufacturing a surface-emitting light emitting device capable of emitting light in a direction perpendicular to a substrate, includes: (a) forming a part that has an emitting surface and functions as a light emitting device; (b) forming a base member on the substrate; (c) discharging a droplet onto an upper surface of the base member to form an optical member precursor; and (d) hardening the optical member precursor to form an optical member.

According to the method of manufacturing the surface-emitting light emitting device of the present invention, by forming in step (b) the base member whose upper surface form, height, mounting position, etc., have been adjusted, and by adjusting in step (c) the discharged amount of the droplet, etc., it is possible to form a surface-emitting light emitting device that includes an optical member whose mounting position, form, and size have been favorably controlled. This is described in detail in the exemplary embodiments below.

The method of manufacturing the surface-emitting light emitting device of the present invention can have the following aspects (1) to (6).

(1) In step (b), the base member may be formed of a material that transmits light of a predetermined wavelength.

(2) In step (c), the discharging of the droplet may be performed using an ink jet method. An "ink jet method" is a method where a droplet is discharged using an ink jet head. With this method, it is possible to finely adjust the discharged amount of the droplet, so that a minute optical member can be easily mounted on the upper surface of the base member. Also, the amount of the discharged droplet can be controlled in the order of picoliters, so that a minute construction can be produced.

(3) In step (d), the optical member precursor can be hardened by applying energy. With this method, the hardening of the optical member precursor can be performed using a simple method.

In this case, in step (d), the optical member precursor can be hardened by irradiating with UV light. According to this method, in hardening the optical member precursor, it is possible to reduce the effects on element characteristics of the surface-emitting light emitting device.

(4) In step (b), it is possible to form the base member so that the angle made between the upper surface of the base member and a surface on a side part of the base member, that contacts the upper surface, is an acute angle. By doing so, in step (b) it is possible to prevent the side surface of the base member from becoming wet due to the droplet. As a result, it is possible to reliably form an optical member with the desired form and size.

In this case, in step (b), an upper part of the base member can be formed in an inversely tapered shape. By doing so, the angle between the upper surface and the side surface of the base member can be reduced, while maintaining the stability of the base member. Thus, in step (b), it is possible to reliably prevent the side surface of the base member from becoming wet due to the droplet. As a result, an optical member with the desired form and size can be formed even more reliably.

(5) In addition, it is possible to further include, before step (c), a step (e) of adjusting the wettability of the upper surface of the base member with respect to the droplet. By doing so, it is possible to reliably form an optical member with the desired form and size. Here, by forming a layer that is lyophilic or liquid-repelling against the droplet on the upper surface of the base member, it is possible to control the wettability of the upper surface of the base member with respect to the droplet.

(6) In addition, it is possible to further include a step (f) of covering at least part of the optical member with a sealing member. By doing so, it is possible to fix the optical member onto the upper surface of the base member using a simple method.

Optical Module and Optical Transmission Apparatus

The present invention can be applied to an optical module that includes the surface-emitting light emitting device of the present invention and an optical wave-guide. The present invention can also be applied to an optical transmission apparatus that includes this optical module.

BRIEF DESCRIPTION OF THE DRAWINGS

FIG. 2 is a plan view showing the surface-emitting light emitting device according to the first exemplary embodiment of the present invention.

FIG. 3 is a cross-sectional view showing one manufacturing process of the surface-emitting light emitting device shown in FIG. 1 and FIG. 2.

FIG. 12 is a cross-sectional view showing a modification of the surface-emitting light emitting device shown in FIG. 1 and FIG. 2.

FIG. 21 is a cross-sectional view showing one manufacturing process of the surface-emitting light emitting device shown in FIG. 16.

FIG. 22 is a cross-sectional view showing a surface-emitting light emitting device according to the fifth exemplary embodiment of the present invention.

DETAILED DESCRIPTION OF PREFERRED EMBODIMENTS

First Exemplary Embodiment

1. Construction of a Surface-Emitting Light Emitting Device

Figure 1:
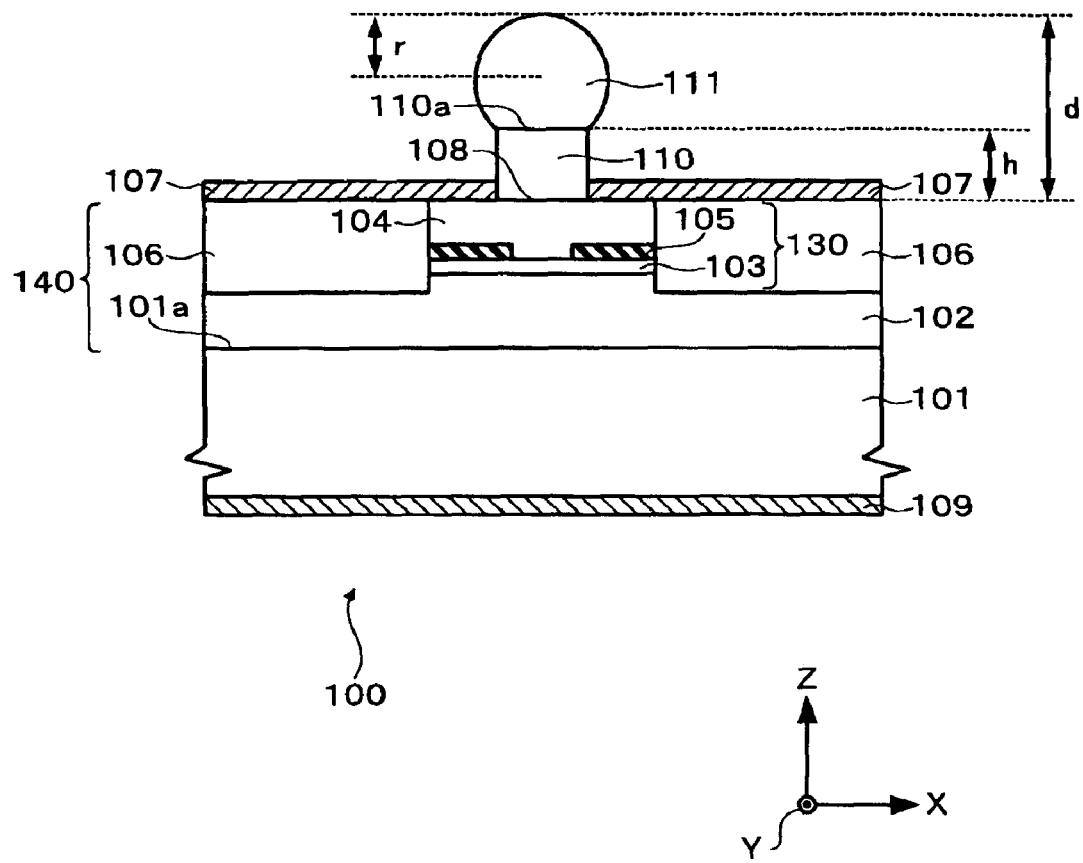
FIG. 1 is a cross-sectional view showing the surface-emitting light emitting device according to the first exemplary embodiment of the present invention.

FIG. 1 is a cross-sectional view showing a model of a surface-emitting light emitting device 100 according to a first exemplary embodiment of the present invention. FIG. 2 is a schematic plan view showing a model of the surface-emitting light emitting device 100 according to the first exemplary embodiment of the present invention. FIG. 1 shows a cross-section taken along the plane A—A in FIG. 2. The case where a surface-emitting semiconductor laser has been used as the surface-emitting light emitting device is described in the present exemplary embodiment.

As shown in FIG. 1, the surface-emitting light emitting device 100 of the present exemplary embodiment includes a semiconductor substrate (a GaAs substrate in the present exemplary embodiment) 101 and a vertical resonator (hereinafter simply "resonator") 140 that is formed on the semiconductor substrate 101. The resonator 140 includes a semiconductor sediment (hereinafter "pillar portion") 130 in the shape of a pillar.

The surface-emitting light emitting device 100 also includes an emitting surface 108 that emits light, a base member 110 that is provided on the emitting surface 108, and an optical member 111 that is provided on an upper surface 110a of the base member 110. The emitting surface 108 is provided on an upper surface of the pillar portion 130, with laser light being emitted from the emitting surface 108.

In the surface-emitting light emitting device 100 of the present exemplary embodiment, a part of the upper surface of the pillar portion 130 that is not covered by a first electrode 107 corresponds to the emitting surface 108. Also in the present exemplary embodiment, a case where the optical member 111 functions as a lens is described.

Base Member

In the present exemplary embodiment, the base member 110 may be made of a material that transmits light of a predetermined wavelength. More specifically, the base member 110 can be made of a material that transmits the light emitted from the emitting surface 108. As examples, the base member 110 may be formed from polyimide resin, acrylic resin, epoxy resin, or fluororesin. Alternatively, as in the surface-emitting light emitting device 400 (see FIG. 16) of the fourth exemplary embodiment described later, the base member may be formed by a semiconductor layer.

There are no particular limitations on the three-dimensional form of the base member 110, but at least it is necessary for the base member 110 to be constructed so that an optical member can be mounted on its upper surface. This point is also the same for the base member of each surface-emitting light emitting device according to the other exemplary embodiments described later.

The height of the base member 110 is determined according to the function as well as the use, form and size of the optical member 111 that is formed on the upper surface 110a of the base member 110. In cases like the present exemplary embodiment, where the optical member 111 functions as a lens, the height "h" of the base member 110 is determined in relation to a radius of curvature "r" of the lens and a distance "d" (see FIG. 1) from the emitting surface 108 to the highest point of the lens 111.

Figure 31:
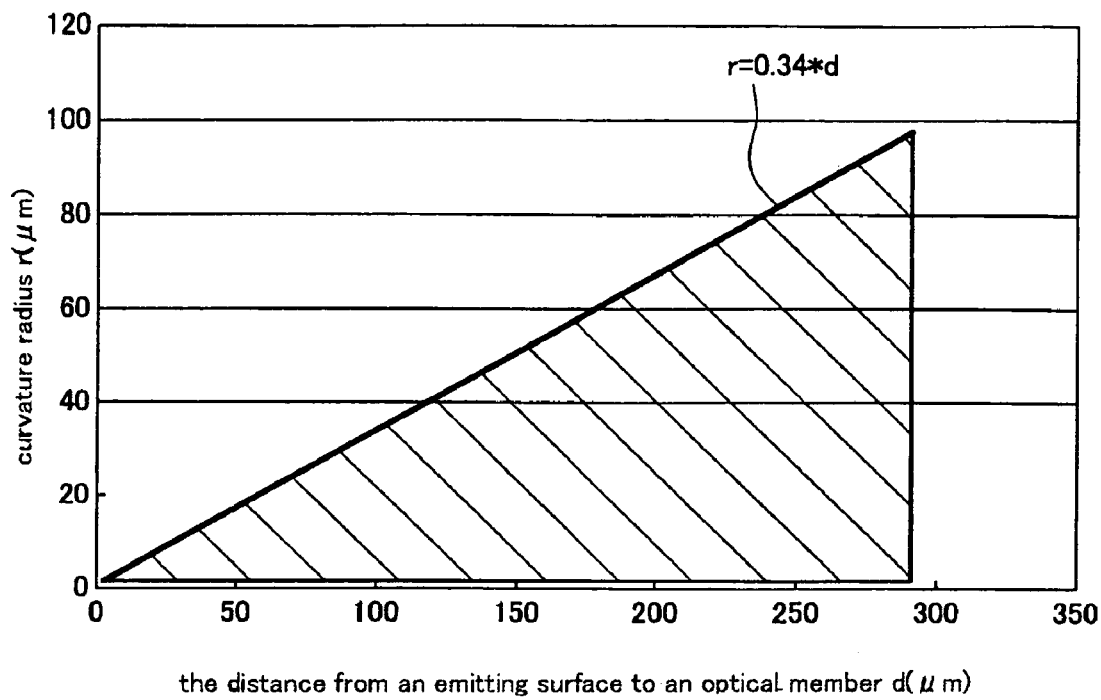
FIG. 31 shows the relationship between the distance from the emitting surface to the highest point on the optical member and the radius of curvature of the optical member.

For example, when the refractive index of the base member 110 and the refractive index of the optical member (lens) 111 are approximately equal, in order for the optical member 111 to function as a lens, as shown in FIG. 31, it is necessary to establish a relationship between the radius of curvature "r" of the optical member (lens) 111 and the distance "d" (see FIG. 1) from the emitting surface 108 to the highest point of the lens that satisfies Equation (1) below.

$$r \leq 0.34 * d \qquad \text{Equation (1)}$$

The radius of curvature "r" of the optical member 111 and the height "h" of the base member 110 are determined so as to satisfy Equation (1). In FIG. 31, the region shown by the diagonal shading is the region that satisfies Equation (1). It should be noted that in this case, when $r=0.34*d$ is satisfied, the light emitted from the optical member 111 is collimated light.

In general, the longer the distance from the emitting surface to the highest point of the lens and the smaller the radius of curvature of the lens, the greater the light-condensing performance of the lens.

Also, the form of the upper surface 110a of the base member 110 is determined according to the function and use of the optical member 111 that is formed on the upper surface 110a of the base member 110. In other words, by controlling the form of the upper surface 110a of the base member 110, it is possible to control the form of the optical member 111.

For example, in the surface-emitting light emitting device 100 (see FIG. 1 and FIG. 2), the upper surface 110a of the base member 110 is in the form of a circle. Also in the surface-emitting light emitting device of each of the exemplary embodiments described later, the case where the upper surface of the base member is in the form of a circle is shown.

When the optical member is used as a lens or a polarizer, for example, the upper surface of the base member is made in the form of a circle. By doing so, the three-dimensional form of the optical member can be formed as a sphere or a truncated sphere, and the obtained optical member can be used as a lens or a polarizer.

In the present exemplary embodiment, an example where the optical member 111 functions as a lens is described. That is, as shown in FIG. 1 and FIG. 2, the light emitted from the emitting surface 108 can be condensed by the optical member 111.

Also, although not illustrated, when the optical member is used as an anisotropic lens or a polarizer, the upper surface of the base member can be formed as an oval. By doing so, the three-dimensional form of the optical member can be an oval sphere or a truncated oval sphere, and the obtained optical member can be used as an anisotropic lens or a polarizer.

Optical Member

The three-dimensional form of the optical member 111 has been described in the "Base Member" section, so that detailed description of such is omitted here.

The optical member 111 is formed, for example, by hardening a liquid material (such as a precursor of an resin cured by ultraviolet or a thermoset resin) that is capable of being hardened through the application of energy, such as heat or light. UV-cured acrylic resin and epoxy resin can be given as examples of UV cured resins. In the same way, thermoset polyimide resin can be given as an example of a thermoset resin.

The precursor of a UV cured resin is hardened by short-term emission of UV light. This means that hardening can be performed without performing any processes, such as a heat treatment, that may damage the device. Accordingly, when the optical member 111 is formed using a precursor of a UV cured resin, it is possible to reduce effects made on the device.

Figure 10:
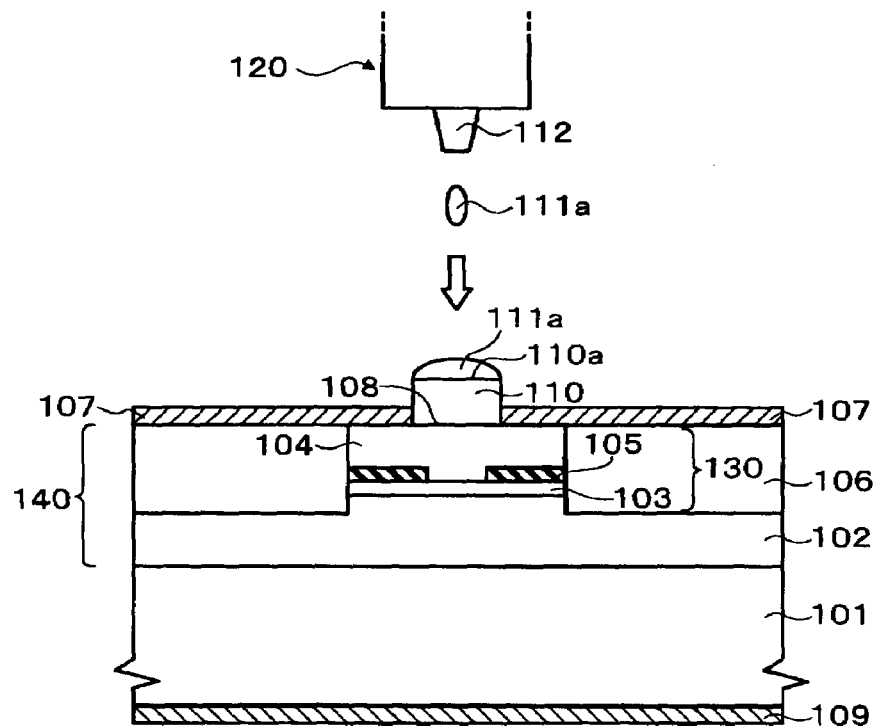
FIG. 10 is a cross-sectional view showing one manufacturing process of the surface-emitting light emitting device shown in FIG. 1 and FIG. 2.
Figure 11:
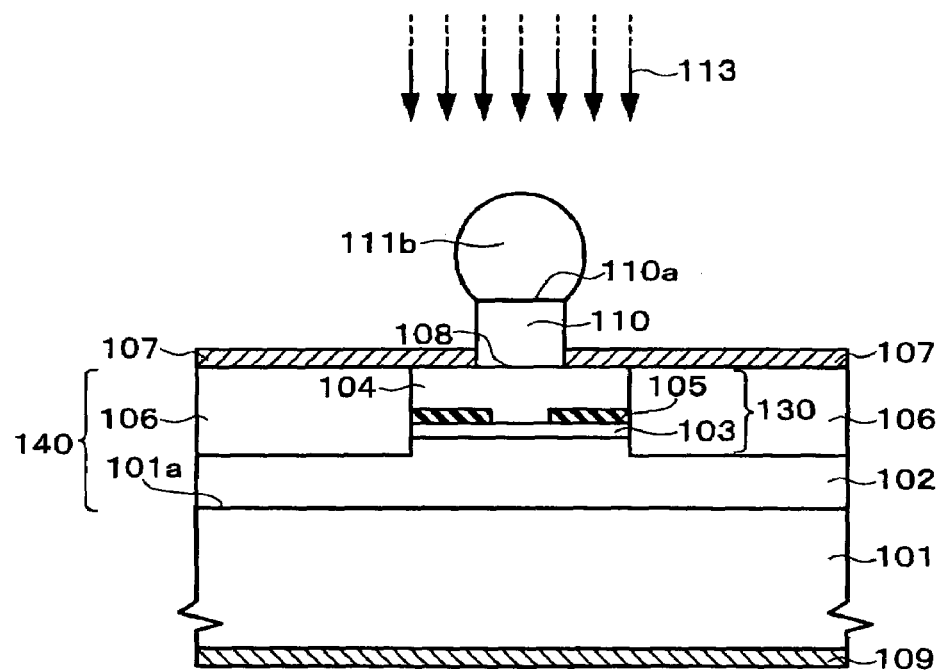
FIG. 11 is a cross-sectional view showing one manufacturing process of the surface-emitting light emitting device shown in FIG. 1 and FIG. 2.

In the present exemplary embodiment, in more detail, the optical member 111 is formed by discharging the droplet 111a of the liquid material mentioned above onto the upper surface 110a of the base member 110, so as to form an optical member precursor 111b and then hardening the optical member precursor 111b (see FIG. 10 and FIG. 11). The method for forming the optical member 111 is described later.

Other Constituents

The surface-emitting light emitting device 100 includes the semiconductor substrate 101 composed of n-type GaAs and a resonator 140 that is formed on the semiconductor substrate 101.

The pillar portion 130 is formed in the resonator 140. Here, the pillar portion 130 is a pillar-shaped semiconductor sediment that is part of the resonator 140 and includes at least an upper mirror 104. The pillar portion 130 is buried in an insulating layer 106. That is, the insulating layer 106 surrounds each side surface of the pillar portion 130. In addition, the first electrode 107 is formed on top of the pillar portion 130.

The resonator 140 is formed with a sediment structure in which a distributive reflection type multilayered mirror (hereinafter, "lower mirror") 102 formed by alternately depositing forty (40) pairs of n-type $Al_{0.9}Ga_{0.1}As$ layers and n-type $Al_{0.15}Ga_{0.85}As$ layers, an active layer 103 that is composed of a GaAs well layer and an $Al_{0.3}Ga_{0.7}As$ barrier layer and includes a quantum well structure composed of triple well layers, and a distributive reflection type multilayered mirror (hereinafter, "upper mirror") 104 formed by alternately depositing twenty five (25) pairs of alternately p-type $Al_{0.9}Ga_{0.1}As$ layers and p-type $Al_{0.15}Ga_{0.85}As$ layers are deposited in that order. Furthermore, the compositions and the numbers of the lower mirror 102, the active layer 103, and the upper mirror 104 are not limited to this example.

The upper mirror 104 is made p-type by doping with carbon, for example, and the lower mirror 102 is made n-type by doping with silicon, for example. Accordingly, a pin diode is formed by the upper mirror 104, the active layer 103 that is not doped with an impurity, and the lower mirror 102.

In addition, the pillar portion 130 is formed in a part of the resonator 140 from a laser light emission side of the surface-emitting light emitting device 100 to a point inside the lower mirror 102 by etching from the laser light emission side in the shape of a circle. Furthermore, although the planar shape of the pillar portion 130 is circular in the present exemplary embodiment, it is possible for this shape to be any freely chosen shape.

In addition, a current aperture 105 made of aluminum oxide is formed in regions close to the active layer 103 in the portion that forms the upper mirror 104. The current aperture 105 is formed in the shape of a ring. That is, the edges of the current aperture 105 taken in a plane parallel with the X-Y plane shown in FIG. 1 are in the form of concentric circles.

Also, in the surface-emitting light emitting device 100 according to the present exemplary embodiment, the insulating layer 106 is formed so as to cover the side surface of the pillar portion 130 and the upper surface of the lower mirror 102.

In the manufacturing process of the surface-emitting light emitting device 100, after the insulating layer 106 that covers the side surface of the pillar portion 130 has been formed, the first electrode 107 is formed on the upper surface of the pillar portion 130 and the upper surface of the insulating layer 106 and a second electrode 109 is formed on a rear surface (a surface on the opposite side of the semiconductor substrate 101 to the surface which the resonator 140 is provided) of the semiconductor substrate 101. When forming such electrodes, it is common to perform an annealing process at around 400° C. (see the manufacturing process described later). Accordingly, when the insulating layer 106 is formed using resin, in order to withstand this annealing process, the resin that composes the insulating layer 106 needs to have superior resistance to heat. In order to satisfy this demand, it is preferable for polyimide resin, fluororesin, acrylic resin, epoxy resin, or the like to be used as the resin that composes the insulating layer 106, and in view of the ease of manufacturing and insulating properties, polyimide resin or fluororesin is especially preferable. In addition, in cases where an optical member (such as a lens) that has resin as a raw material is formed on the insulating layer 106, to increase the contact angle with the lens material (resin) and make it easy to control the lens shape, it is preferable for the insulating layer 106 to be made of polyimide resin or fluororesin. In this case, the insulating layer 106 is formed by hardening a resin precursor through irradiation with energy such as heat or light or through a chemical function.

The first electrode 107 is also formed on the pillar portion 130 and the insulating layer 106. Additionally, a part (opening) where the first electrode 107 is not formed is provided in the center of the upper surface of the pillar portion 130. This part is the emitting surface 108. The emitting surface 108 is an emission opening for laser light. The first electrode 107 is formed of multilayered films of an alloy of gold with zinc and gold, for example.

In addition, the second electrode 109 is formed on the rear surface of the semiconductor substrate 101. That is, in the surface-emitting light emitting device 100 shown in FIG. 1, the first electrode 107 is joined onto the pillar portion 130 and the second electrode 109 is joined onto the rear surface of the semiconductor substrate 101, with a current being injected into the active layer 103 by the first electrode 107 and the second electrode 109. The second electrode 109 is formed of multilayered films of an alloy of gold with germanium and gold, for example.

The materials for forming the first electrode 107 and the second electrode 109 are not limited to those mentioned above, and for example it is possible to use metals such as titanium and platinum and alloys of such.

2. Operation of the Surface-Emitting Light Emitting Device

The following describes the standard operation of the surface-emitting light emitting device 100 according to the present exemplary embodiment. The driving method of the surface emitting semiconductor laser described below is only one example, and a variety of modifications are possible without departing from the gist of the present invention.

First, when a voltage is applied in the forward direction to the pin diode at the first electrode 107 and the second electrode 109, electrons are recombined with holes in the active layer 103, with such recombining resulting in the emission of light. When the light generated there reciprocally moves between the upper mirror 104 and the lower mirror 102, induced emission occurs, which amplifies the intensity of the light. When the light gain exceeds the light loss, laser oscillation occurs, and laser light is emitted from the emitting surface 108 that is on the upper surface of the pillar portion 130 and then enters the optical member 111. The laser light that enters the optical member 111 has its radiation angle adjusted by the optical member 111, and is emitted in a perpendicular direction with respect to the semiconductor substrate 101. Here, the expression "a perpendicular direction with respect to the semiconductor substrate 101" refers to a direction (the direction Z in FIG. 1) that is perpendicular to the surface 101a (a plane that is parallel with the X-Y plane in FIG. 1) of the semiconductor substrate 101.

3. Manufacturing Method of the Surface-Emitting Light Emitting Device

The following describes one example of a manufacturing method for the surface-emitting light emitting device 100 according to the first exemplary embodiment of the present invention, with reference to FIGS. 3 to 11. FIGS. 3 to 11 are cross-sectional views showing models for each manufacturing process of the surface-emitting light emitting device 100 of the exemplary embodiment shown in FIG. 1 and FIG. 2, with each drawing corresponding to the cross-section shown in FIG. 1.

(1) First, epitaxial growth is performed on the surface of the semiconductor substrate 101 that is made of n-type GaAs, while modulating the composition, so that a semiconductor multilayered film 150 is formed as shown in FIG. 3. Here, as one example, the semiconductor multilayered film 150 is composed of the lower mirror 102 alternately depositing forty (40) pairs of n-type $Al_{0.9}Ga_{0.1}As$ layers and n-type $Al_{0.15}Ga_{0.85}As$ layers, the active layer 103 that is composed of a GaAs well layer and an $Al_{0.3}Ga_{0.7}As$ barrier layer and includes a quantum well structure composed of triple well layers, and the upper mirror 104 alternately depositing twenty five (25) pairs of p-type $Al_{0.9}Ga_{0.1}As$ layers and p-type $Al_{0.15}Ga_{0.85}As$ layers. By depositing these layers in this order on the semiconductor substrate 101, the semiconductor multilayered film 150 is formed.

When the upper mirror 104 is formed, at least one layer near the active layer is formed as an AlAs layer or an AlGaAs layer with an Al composition of at least 0.95. Such a layer is then oxidized to become the current aperture 105. Also, it is preferable for the layer of the upper mirror 104 closest to the surface to have a high carrier density and to be suited to ohmic contact with the electrode (the first electrode 107 described later).

The temperature used when performing epitaxial growth is determined as appropriate, for the growth method, the raw material, the type of the semiconductor substrate 101, or the type, thickness and carrier density of the semiconductor multilayered film 150 to be formed, and in general is preferably 450 to 800° C. The time required when performing epitaxial growth is determined, as appropriate, in the same way as the temperature. Furthermore, MOVPE (Metal-Organic Vapor Phase Epitaxy), MBE (Molecular Beam Epitaxy), or LPE (Liquid Phase Epitaxy) may be used as the method used for the epitaxial growth.

Next, after a photoresist (not shown in the drawing) has been applied onto the semiconductor multilayered film 150, photolithography is used for patterning the photoresist, thereby forming a predetermined pattern of the resist layer R100 (see FIG. 3).

Figure 4:
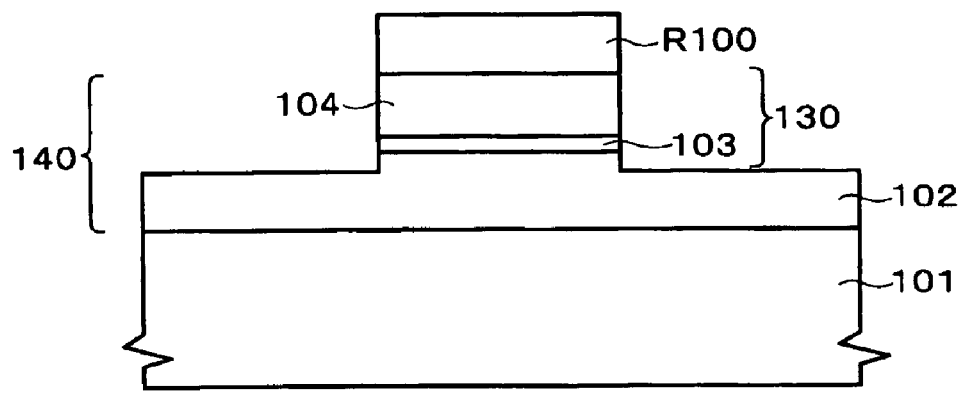
FIG. 4 is a cross-sectional view showing one manufacturing process of the surface-emitting light emitting device shown in FIG. 1 and FIG. 2.

(2) Next, the resist layer R100 used as a mask and dry etching, for example, is used to etch parts of the upper mirror 104, the active layer 103 and the lower mirror 102, so that the semiconductor sediment (pillar portion) 130 in the form of a pillar is formed as shown in FIG. 4. As shown in FIG. 4, the above process results in a resonator 140 that includes the pillar portion 130 being formed on the semiconductor substrate 101. After this, the resist layer R100 is removed.

Figure 5:
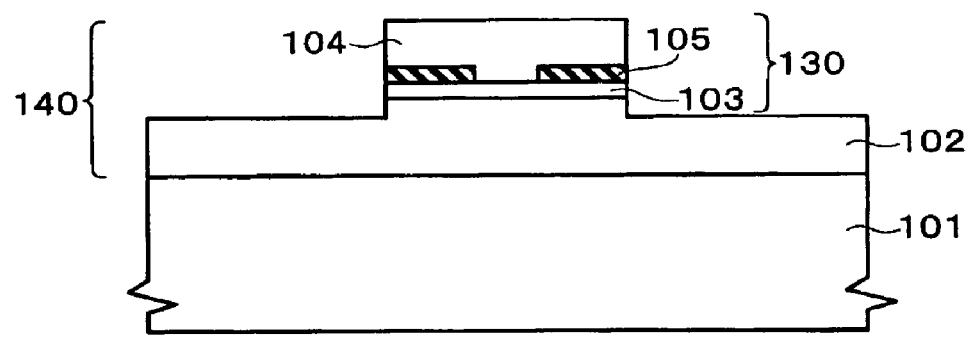
FIG. 5 is a cross-sectional view showing one manufacturing process of the surface-emitting light emitting device shown in FIG. 1 and FIG. 2.

(3) Next, by inserting the semiconductor substrate 101, on which the resonator 140 has been formed by the above processes, into a water vapor atmosphere of around 400° C., for example, the layers in the upper mirror 104 described above that have a high Al composition are oxidized starting from the side surface, thereby forming the current aperture 105 (see FIG. 5). The oxidization rate depends on the temperature of a furnace, the supply rate of the water vapor, and the Al composition and thickness of the layers (the layers with the high Al composition mentioned above) to be oxidized. When a surface-emitting laser with a current aperture formed by oxidization is driven, a current flows only in the parts (the non-oxidized parts) where the current aperture is not formed. Accordingly, it is possible to control the current density by controlling the region where the current aperture 105 is formed in the process that forms the current aperture through oxidization.

Figure 6:
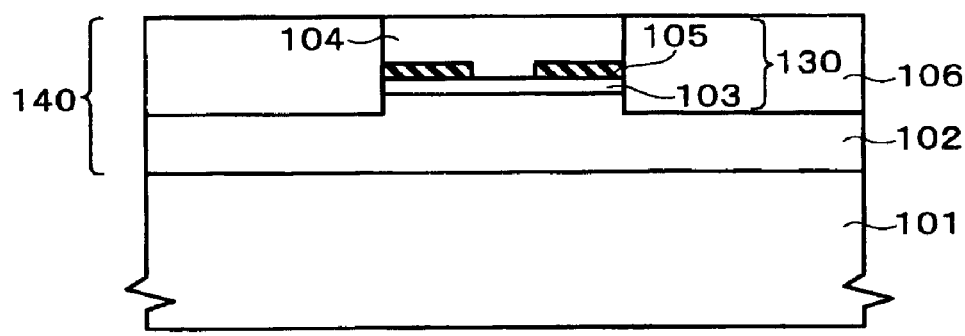
FIG. 6 is a cross-sectional view showing one manufacturing process of the surface-emitting light emitting device shown in FIG. 1 and FIG. 2.

(4) Next, the insulating layer 106 that surrounds the pillar portion 130 is formed (see FIG. 6). The following describes the case where polyimide resin is used as the material for forming the insulating layer 106.

First, spin coating is used to apply a resin precursor (polyimide precursor) onto the resonator 140, and then by performing imidization, the insulating layer 106 is formed around the pillar portion 130 as shown in FIG. 6. The method disclosed in Japanese Unexamined Patent Application Publication No. 2001-066299, for example, can be used as this method for forming the insulating layer 106. Aside from the spin coating method described above, any suitable technique, such as dipping, spray coating, or an ink jet method can be used as the method of forming the resin precursor layer.

Figure 7:
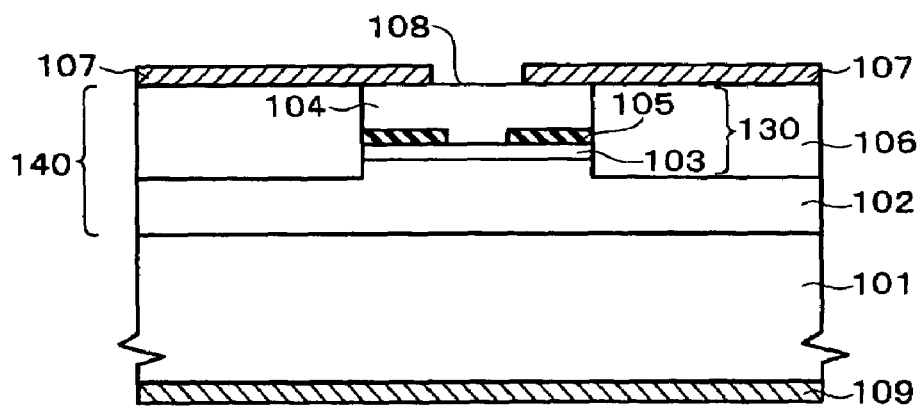
FIG. 7 is a cross-sectional view showing one manufacturing process of the surface-emitting light emitting device shown in FIG. 1 and FIG. 2.

(5) Next, the first electrode 107 and the second electrode 109 for injecting a current into the active layer 103 and the emitting surface 108 for the laser light are formed (see FIG. 7).

First, plasma processing is used to clean the upper surface of the pillar portion 130 as necessary, before the first electrode 107 and the second electrode 109 are formed. By doing so, it is possible to form an element with more stable characteristics. Next, a multilayered film (not shown in the drawing) of a gold-zinc alloy and gold, for example, is formed on the upper surfaces of the insulating layer 106 and the pillar portion 130 by vacuum deposition, for example, and then a lift-off method is used to form a part on the upper surface of the pillar portion 130 where the multilayered film is not formed. The part becomes the emitting surface 108. In this process, dry etching may be used in place of the lift-off method.

Furthermore, a multilayered film (not shown in the drawings) of a gold-germanium alloy and gold, for example, is formed on the rear surface of the semiconductor substrate 101 by vacuum deposition, for example. Next, an annealing process is performed. The temperature of this annealing process depends on the electrode materials. In the case of the electrode materials used in the present exemplary embodiment, the annealing is usually performed at around 400° C. As a result of the above processes, the first electrode 107 and the second electrode 109 are formed (see FIG. 7). By doing so, the part of the surface-emitting light emitting device 100 that functions as the light emitting device is formed.

Figure 8:
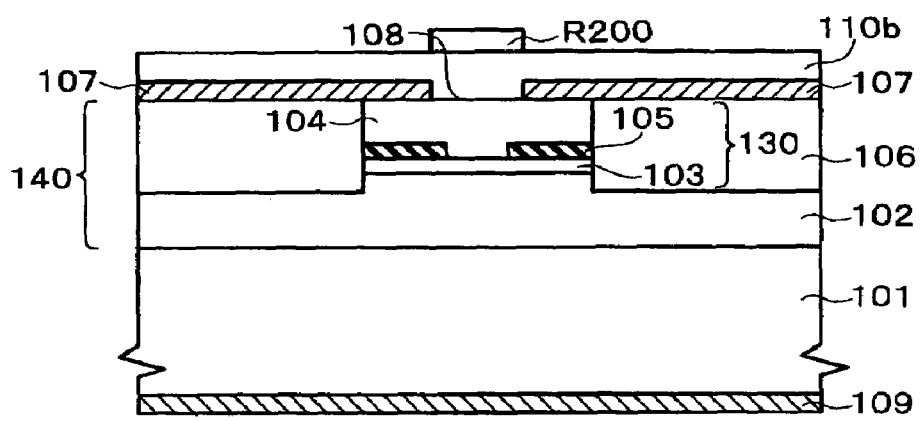
FIG. 8 is a cross-sectional view showing one manufacturing process of the surface-emitting light emitting device shown in FIG. 1 and FIG. 2.
Figure 9:
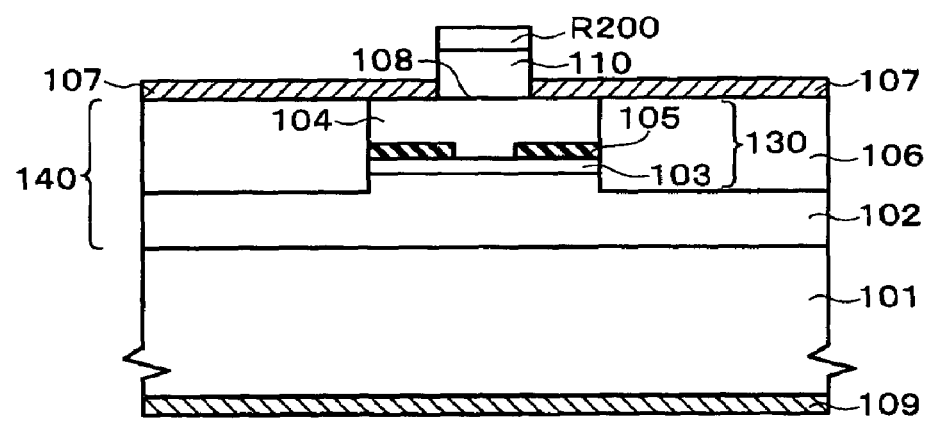
FIG. 9 is a cross-sectional view showing one manufacturing process of the surface-emitting light emitting device shown in FIG. 1 and FIG. 2.

(6) Next, the base member 110 for mounting the optical member 111 (see FIG. 1) is formed on the emitting surface 108 (see FIGS. 8 and 9).

When forming the base member 110, a method (such as selective growth, dry etching, wet etching, a lift-off method, and a transfer method) that is suitable for the material, the form, and the size of the base member 110 can be selected. In the present exemplary embodiment, the case where the base member 110 is formed through patterning using wet etching is described.

First, as shown in FIG. 8, a resin layer 110b is formed on at least the emitting surface 108. In the present exemplary embodiment, a case where the resin layer 110b is formed over the entire emitting surface 108 and the entire first electrode 107 by spin coating, for example, is described.

Next, a resist layer R200 with a predetermined pattern is formed on the resin layer 110b. The resist layer R200 is used for forming the base member 110 by patterning the resin layer 110b. More specifically, in a photolithography process, the resist layer R200 is used as a mask, and the resin layer 110b is patterned by wet etching using an alkaline solution, for example, as an etchant. By doing so, the base member 110 is formed on the emitting surface 108 as shown in FIG. 9.

(7) Next, the optical member 111 is formed on the upper surface 110a of the base member 110 (see FIG. 10 and FIG. 11).

First, as necessary, a process that adjusts the wetting angle of the optical member 111 (see FIG. 1) is performed on the upper surface 110a of the base member 110. According to this process, when a liquid material 111a is introduced onto the upper surface 110a of the base member 110 in a process that is described later, it is possible to obtain an optical member precursor 111b of a desired form, and as a result it is possible to obtain an optical member 11 of a desired form (see FIG. 10 and FIG. 11).

Next, the droplets of the liquid material 111a are discharged towards the upper surface 110a of the base member 110 using an ink jet method, for example. As examples of the ink jet method, (i) a method where a liquid is discharged by generating a voltage by changing the size of bubbles in the liquid (here, the lens material) with heat, and (ii) a method where a liquid is discharged by a voltage generated by a piezoelectric element are available. In view of the ability to control the voltage, the second method is preferable.

The alignment of the position of the nozzle of the ink jet head and the discharge position of the droplet is performed using a well-known image recognition technique used in an exposure process and inspection process in the manufacturing process of a normal semiconductor integrated circuit. For example, as shown in FIG. 10, alignment may be performed for the position of a nozzle 112 of an ink jet head 120 and the position of the base member 110 of the surface-emitting light emitting device 100. Subsequently, after the voltage applied to the ink jet head 120 is controlled, the droplets of the liquid material 111a are discharged. By doing so, as shown in FIG. 11, the optical member precursor 111b is formed on the upper surface 110a of the base member 110.

In this case, as shown in FIG. 10, when the droplet discharged from the nozzle 112 impacts the upper surface 110a of the base member 110, the liquid material 111a deforms according to surface tension so as to come in the center of the upper surface 1110a of the base member 110, and thereby the position is automatically corrected.

Also, in this case, the form and the size of the optical member precursor 111b (see FIG. 11) depend on the form and size of the upper surface 110a of the base member 110, the discharged amount of the liquid material 111a, the surface tension of the liquid material 111a, and the interfacial tension between the upper surface 110a of the base member 110 and the liquid material 111a. Accordingly, by controlling such factors, the form and size of the optical member 111 (see FIG. 1) that is finally obtained can be controlled, so that there is increased versatility in lens design.

After the processes described above have been performed, as shown in FIG. 11, the optical member precursor 111b is hardened by irradiation with energy rays (such as UV light) 113 and so forms the optical member 111 that functions as a lens on the upper surface 110a of the base member 110 (see FIG. 1). The suitable wavelength and irradiation amount for the UV light depend on the material of the optical member precursor 111b. As one example, when the optical member precursor 111b is formed using a precursor of an acrylic UV cured resin, hardening is performed through irradiation with UV light with a wavelength of around 350 nm and an intensity of 10 mW for five minutes. The surface-emitting light emitting device 100 shown in FIG. 1 is obtained by the above processes.

4. Function and Effects

The surface-emitting light emitting device 100 of the present exemplary embodiment has the function and effects described below.

(A) First, by having the optical member 111 provided on the upper surface 110a of the base member 110, it is possible to provide sufficient length for the optical path of the laser light that is emitted from the emitting surface 108. That is, by providing the optical member 111 on the emitting surface 108 via the base member 110, a sufficient distance can be provided from the emitting surface 108 to the optical member 111. This makes it possible to increase the condensing performance of the optical member 111 as a lens.

(B) Second, the size and form of the optical member 111 can be precisely controlled. When forming the optical member 111, as described in the process (7) above, the optical member precursor 111b is formed on the upper surface 110a of the base member 110 in the process that forms the optical member 111 (see FIG. 10 and FIG. 11). Here, so long as the side surface 110b of the base member 110 is not wetted by the liquid material that composes the optical member precursor 111b, the surface tension of the base member 110 does not act on the optical member precursor 111b and it is the surface tension of the liquid material described above that mainly acts. Accordingly, by controlling the amount of the liquid material (the droplet 111a) described above used to form the optical member 111, the form of the optical member precursor 111b can be controlled. By doing so, it is possible to form an optical member 111 whose form has been controlled more precisely. As a result, an optical member 111 of the desired form and size can be obtained.

(C) Third, it is possible to precisely control the mounting position of the optical member 111. As described above, the optical member 111 is formed by discharging the droplet of the liquid material 111a onto the upper surface 110a of the base member 110 to form the optical member precursor 111b and then hardening the optical member precursor 111b (see FIG. 11). It is usually difficult to precisely control the mounting position of the discharged droplet. However, with this method, the optical member 111 can be formed on the upper surface 110a of the base member 110 without performing any particular alignment process. That is, by simply discharging the droplet 111a onto the upper surface 110a of the base member 110, it is possible to form the optical member precursor 111b without performing alignment. Putting this another way, the optical member 111 can be formed with the alignment precision used when forming the base member 110. By doing so, the optical member 111 whose mounting positions are controlled, can be formed easily and with a favorable yield.

In particular, when the droplet 111a are discharged using an ink jet method, the droplet 111a can be discharged at more appropriate positions, so that the optical member 111 whose mounting positions are more reliably controlled can be formed easily and with a favorable yield. In addition, by discharging the droplet 111a using an ink jet method, the amount of discharged droplet 111a can be controlled in units in the order of pico liters, so that a minute construction can be produced correctly.

(D) Fourth, by setting the form and area of the upper surface 110a of the base member 110, it is possible to set the form and size of the optical member 111. In particular, by appropriately selecting the form of the upper surface 110a of the base member 110, it is possible to form the optical member 111 that has a predetermined function. Accordingly, by changing the form of the upper surface 110a of the base member 110, it is possible for optical members with different functions to be deposited on the same substrate.

According to the present exemplary embodiment, while the case where the surface-emitting light emitting device 100 is a surface-emitting semiconductor laser has been described, the present invention can be applied to light-emitting devices other than surface-emitting semiconductor lasers. This is the same for the surface-emitting light emitting device in each of the second to sixth and eighth exemplary embodiments that are described later. The present invention regarding the surface-emitting light emitting device can be applied to an EL (electroluminescent) element or semiconductor light emitting diode for example.

5. Modification

Next, a modification of the surface-emitting light emitting device 100 according to the present invention is described with reference to FIG. 12. FIG. 12 is a cross-sectional view showing a model of a modification (the surface-emitting light emitting device 190) of the surface-emitting light emitting device 100 according to the present exemplary embodiment.

As shown in FIG. 12, in the surface-emitting light emitting device 190 of the present modification, a sealing member 131 is formed so as to cover at least part of the optical member 111. By doing so, the optical member 111 can be precisely fixed on the upper surface 110a of the base member 110. The sealing member 131 preferably has a smaller refractive index than the optical member 111. The material of the sealing member 131 is not especially limited, and as one example resin can be used.

Aside from the above point, the modification has the same construction as the surface-emitting light emitting device 100 according to the present exemplary embodiment, and so has the same function and effects.

6. Other Modifications

Figure 13:
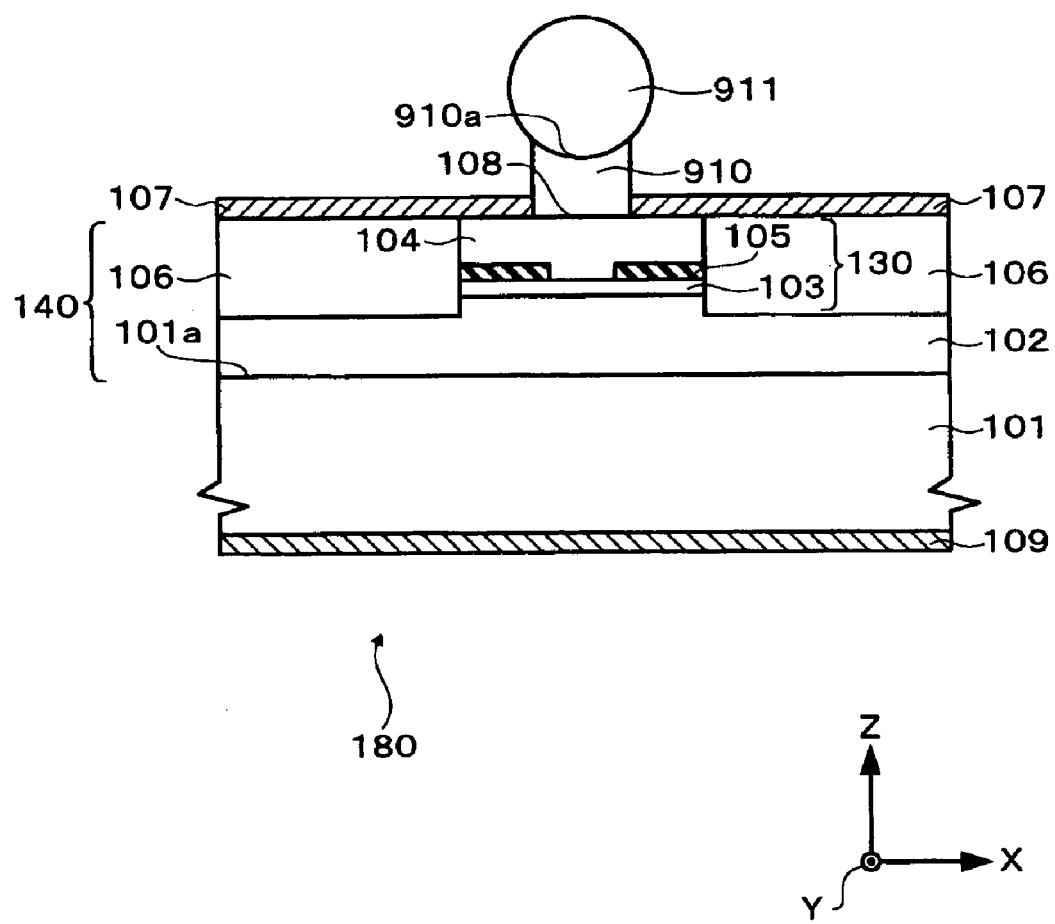
FIG. 13 is a cross-sectional view showing another modification of the surface-emitting light emitting device shown in FIG. 1 and FIG. 2.

Next, another modification of the surface-emitting light emitting device 100 of the present exemplary embodiment is described with reference to FIG. 13. FIG. 13 is a cross-sectional view showing a model of another modification (the surface-emitting light emitting device 180) of the surface-emitting light emitting device 100 according to the present exemplary embodiment.

As shown in FIG. 13, in the surface-emitting light emitting device 180 according to the present exemplary embodiment, an upper surface 910a of a base member 910 is a curved surface. By using this construction, it is possible to set an approximately spherical optical member 911 on the upper surface 910a of the base member 910.

Aside from the above point, the modification has the same construction as the surface-emitting light emitting device 100 according to the present exemplary embodiment, and has the same function and effects. Furthermore, it is also possible to make the upper surface of the base member a curved surface in the surface-emitting light emitting device of each of the other exemplary embodiments described later.

Second Exemplary Embodiment

1. Construction of the Surface-Emitting Light Emitting Device

Figure 14:
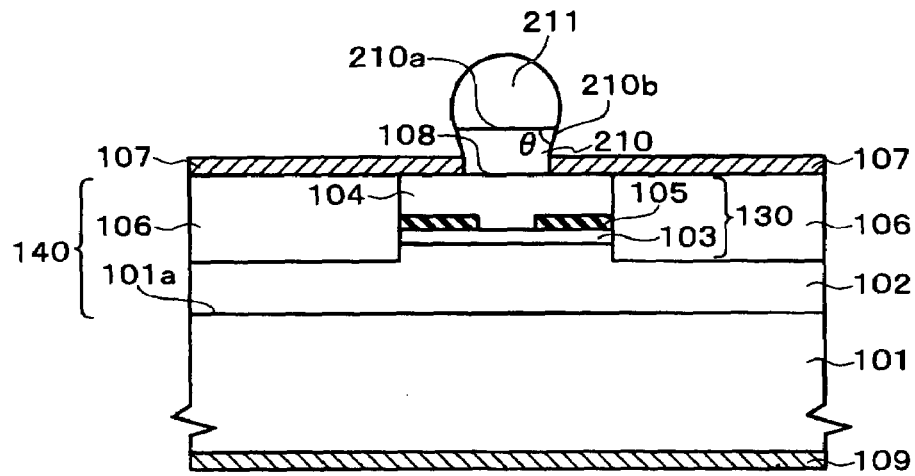
FIG. 14 is a cross-sectional view showing a surface-emitting light emitting device according to the second exemplary embodiment of the present invention.

FIG. 14 is a cross-sectional view showing a model of a surface-emitting light emitting device 200 according to a second exemplary embodiment of the present invention. Like the first exemplary embodiment, this embodiment has been described for the case where a surface-emitting semiconductor laser is used as the surface-emitting light emitting device.

Aside from a sidewall of a base member 210 being inversely tapered, the surface-emitting light emitting device 200 of the present exemplary embodiment has almost the same construction as the surface-emitting light emitting device 100 of the first exemplary embodiment. For this reason, construction elements that are effectively the same as those in the surface-emitting light emitting device 100 according to the first exemplary embodiment have been given the same reference numerals, and detailed description of such has been omitted.

As shown in FIG. 14, the angle θ made between an upper surface 210a and a side surface 210b of the base member 210, can be set at an acute angle. That is, as mentioned above, the base member 210 can be made so that the sidewall of the base member 210 is inversely tapered. Here, the side surface 210b of the base member 210 refers to the surface that contacts the 210a on the side part of the base member 210. On the base member 210, the side part of the base member 210 is the side surface 210b. Here, the material of the base member 210 is the same as the material of the base member 110 of the first exemplary embodiment. That is, the base member 210 is composed of a material that can transmit the light emitted from the emitting surface 108. Also, the construction, material, and function of an optical member 211 are the same as the construction, material, and function of the optical member 111 of the first exemplary embodiment. In addition, the optical member 211 can be formed using the same method as the optical member 111 of the first exemplary embodiment.

2. Operation of the Surface-Emitting Light Emitting Device

The operation of the surface-emitting light emitting device 200 of the present exemplary embodiment is fundamentally the same as that of the surface-emitting light emitting device 100 of the first exemplary embodiment, so detailed description of such has been omitted.

3. Method of Manufacturing the Surface-Emitting Light Emitting Device

Apart from the formation of the sidewall of the base member 210 in an inversely tapered shape, the method of manufacturing the surface-emitting light emitting device 200 of the present exemplary embodiment is the same as the method of manufacturing the surface-emitting light emitting device 100 of the first exemplary embodiment. For this reason, detailed description of such has been omitted.

4. Function and Effects

The surface-emitting light emitting device 200 according to the present exemplary embodiment and its method of manufacturing have effectively the same function and effects as the surface-emitting light emitting device 100 according to the first exemplary embodiment and its method of manufacturing. In addition, the surface-emitting light emitting device 200 according to the present exemplary embodiment and its method of manufacturing have the function and effects described below.

The optical member 211 is formed by discharging a droplet onto the upper surface 210a of the base member 210 to form an optical member precursor (not shown in the drawings), and then hardening the optical member precursor. In this case, the angle θ between the upper surface 210a of the base member 210 and the side surface 210b is an acute angle, so that when the droplet is discharged onto the upper surface 210a of the base member 210, the side surface 210b of the base member 210 can be reliably prevented from becoming wet due to the droplet. As a result, an optical member 211 with the desired shape and size can be reliably formed.

Third Exemplary Embodiment

1. Construction of the Surface-Emitting Light Emitting Device

Figure 15:
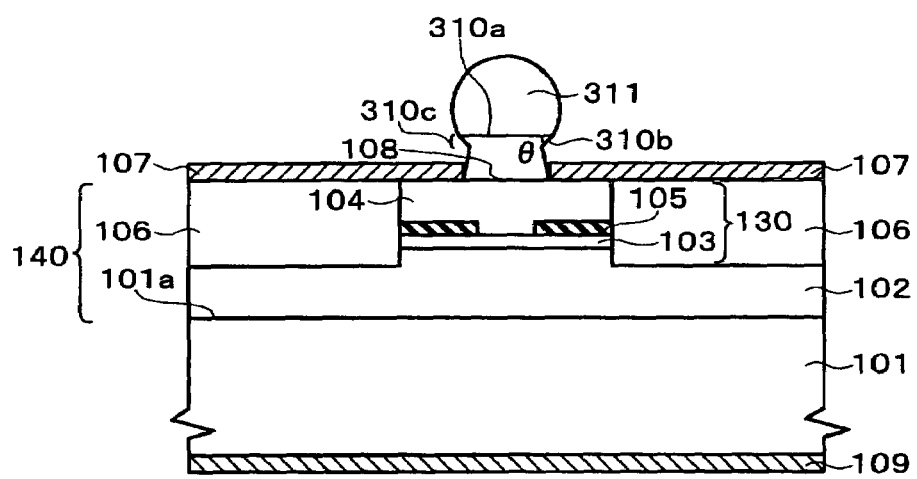
FIG. 15 is a cross-sectional view showing a surface-emitting light emitting device according to the third exemplary embodiment of the present invention.

FIG. 15 is a cross-sectional view showing a model of a surface-emitting light emitting device 300 according to a third exemplary embodiment of the present invention. Like the first and second exemplary embodiments, this embodiment has been described for the case where a emitting surface-emitting semiconductor laser is used as the surface-emitting light emitting device.

Aside from an upper part 310c of a base member 310 being inversely tapered, the surface-emitting light emitting device 300 of the present exemplary embodiment has almost the same construction as the surface-emitting light emitting device 100 of the first exemplary embodiment. For this reason, construction elements that are effectively the same as those in the surface-emitting light emitting device 100 according to the first exemplary embodiment have been given the same reference numerals, and detailed description of such has been omitted.

As described above, the upper part 310c of the base member 310 in the surface-emitting light emitting device 300 is inversely tapered. In this case, the angle θ, made between the upper surface 310a of the base member 310 and a side surface 310b (a surface that contacts the upper surface 310a at the side of the base member 310), is an acute angle. Here, the material of the base member 310 is the same as the material of the base member 110 in the first exemplary embodiment. That is, the base member 310 is composed of a material that can transmit the light emitted from the emitting surface 108. Also, the construction, material, and function of an optical member 311 are the same as the construction, material, and function of the optical member 111 of the first exemplary embodiment. In addition, the optical member 311 can be formed using the same method as the optical member 111 of the first exemplary embodiment.

2. Operation of the Surface-Emitting Light Emitting Device

The operation of the surface-emitting light emitting device 300 of the present exemplary embodiment is fundamentally the same as that of the surface-emitting light emitting device 100 of the first exemplary embodiment, so detailed description of such has been omitted.

3. Method of Manufacturing the Surface-Emitting Light Emitting Device

Apart from the base member 310 being formed with the upper part 310c of the base member 310 in an inversely tapered shape, the method of manufacturing the surface-emitting light emitting device 300 of the present exemplary embodiment is the same as the method of manufacturing the surface-emitting light emitting device 100 of the first exemplary embodiment. Accordingly, the process that is different to the method of manufacturing the surface-emitting light emitting device 100 of the first exemplary embodiment, which is to say, the process that forms the base member 310, is mainly described below.

The parts of the surface-emitting light emitting device 300 that function as the light emitting device are formed by the same method as processes in (1) to (5) described above in the method of manufacturing the surface-emitting light emitting device according to the first exemplary embodiment described above (see FIGS. 3 to 7). Subsequently, after a resin layer 110b has been formed using the sane method as the process in (6) described above (see FIG. 8), a resist layer R200 of a predetermined pattern is formed on this resin layer 110b. This resist layer R200 is used in a later process to pattern the resin layer 110b so as to form the base member 310.

After this, a heat treatment is performed at a temperature (for example, at 130° C.) that does not affect the resist. In the heat treatment, heat is applied from the upper surface side of the resin layer 110b, so that the extent of the hardening is larger for the upper surface side (the resist layer R200 side) of the resin layer 110b than for the substrate 101 side part of the resin layer 110b.

Next, the resin layer 110b is wet-etched with the resist layer R200 as a mask. In this process, the penetration speed of the etchant is slower for the part directly below the resist layer R200, which is to say, the upper part of the resin layer 110b, than for the other parts, so that it is difficult for the upper part to be etched. Also, due to the heat treatment the extent of the hardening is larger for the upper surface side part of the resin layer 110b than for the substrate 101 side part, so that in the resin layer 110b, the etching rate of the wet etching is lower for the part on the upper surface side than for the part on the substrate 100 side. This means that during the wet etching, the etching speed is slower for the upper surface side part of the resin layer 110b than for the part of the resin layer 110b on the substrate 100 side, and thereby more of the upper surface side part of the resin layer 110b remains compared to the part of the resin layer 110b on the substrate 100 side. Accordingly, a base member 310 (see FIG. 15) formed with an inversely tapered upper part 310c can be obtained. After this, the resist layer R200 is removed.

The processes thereafter are the same as in the method of manufacturing according to the first exemplary embodiment (the process in (7) of the first exemplary embodiment), so that detailed description of such has been omitted. Thus, the surface-emitting light emitting device 300 is obtained (see FIG. 15).

4. Function and Effects

The surface-emitting light emitting device 300 according to the present exemplary embodiment and its method of manufacturing have effectively the same function and effects as the surface-emitting light emitting device 100 according to the first exemplary embodiment and its method of manufacturing. In addition, the surface-emitting light emitting device 300 according to the present exemplary embodiment and its method of manufacturing have the function and effects described below.

As regards the surface-emitting light emitting device 300, the base member 310 is formed so that the upper part 310c of the base member 310 is inversely tapered, and thereby the angle θ between the upper surface 310a and the side surface 310b of the base member 310 can be reduced while maintaining the stability of the base member 310. This makes it possible to reliably stop the side surface 310b of the base member 310 from becoming wet due to the droplet. As a result, an optical member 311 with a desired shape and size can be formed more reliably.

Fourth Exemplary Embodiment

1. Construction of the Surface-Emitting Light Emitting Device

Figure 16:
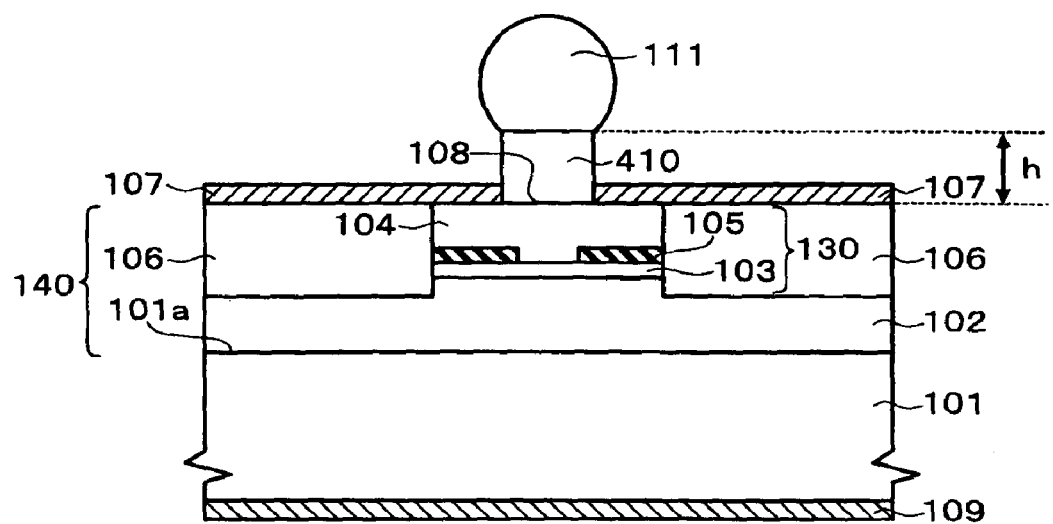
FIG. 16 is a cross-sectional view showing a surface-emitting light emitting device according to the fourth exemplary embodiment of the present invention.

FIG. 16 is a cross-sectional view showing a model of a surface-emitting light emitting device 400 according to a fourth exemplary embodiment of the present invention. Like the first to third exemplary embodiments, this embodiment has been described for the case where an emitting surface-emitting semiconductor laser is used as the surface-emitting light emitting device.

Aside from a base member 410 being made of a semiconductor layer, the surface-emitting light emitting device 400 of the present exemplary embodiment has almost the same construction as the surface-emitting light emitting device 100 of the first exemplary embodiment. For this reason, construction elements that are effectively the same as those in the surface-emitting light emitting device 100 according to the first exemplary embodiment have been given the same reference numerals, and detailed description of such has been omitted.

As mentioned above, the base member 410 is made of a semiconductor layer. This semiconductor layer has a property whereby it is able to transmit the light that has been emitted from the emitting surface 108. The base member 410 can also be formed so as to be integrated with the pillar portion 130. More specifically, the layer that constructs the base member 410 can be deposited in the same way as the pillar portion 130 using epitaxial growth.

In the present exemplary embodiment, the pillar portion 130 is formed of an AlGaAs semiconductor layer, as described in the first exemplary embodiment. In this case, when the wavelength of the laser light emitted from the pillar portion 130 (the oscillation wavelength of the resonator 140) is 850 nm, for example, the base member 410 can be formed from a layer with an Al composition (molar fraction) of 30% or above. By doing so, the aforementioned laser light that enters the base member 410 from the emitting surface 108 can be transmitted by the base member 410.

Furthermore, when the base member 410 is made of a layer with the composition described above, the base member 410 functions as part of the pillar portion 130. More specifically, since the base member 410 is formed above the upper mirror 104, the base member 410 functions as part of the upper mirror 104. In this case, if the oscillation wavelength of the resonator 140 (see FIG. 16) is assumed to be $\lambda$, the height of the base member 410 can be formed at $n\lambda/4$ (where n is an integer). Thus, the reflectance can be prevented from falling.

2. Operation of the Surface-Emitting Light Emitting Device

The operation of the surface-emitting light emitting device 400 of the present exemplary embodiment is fundamentally the same as that of the surface-emitting light emitting device 100 of the first exemplary embodiment, so detailed description of such has been omitted.

3. Method of Manufacturing the Surface-Emitting Light Emitting Device

Next, an example of the method of manufacturing the surface-emitting light emitting device 400 according to the present exemplary embodiment is described using FIGS. 17 to 21. FIGS. 17 to 21 are cross-sectional views showing a model of the surface-emitting light emitting device 400 according to the present exemplary embodiment, and corresponding to the cross-sectional view shown in FIG. 16.

First, the semiconductor multilayered film 150 is formed by using the same method as the process in (1) described above (see FIG. 3), out of the method of manufacturing the surface-emitting light emitting device 100 according to the first exemplary embodiment described above. This semiconductor multilayered film 150 has the same composition and thickness as the semiconductor multilayered film 150 shown in FIG. 3.

Next, a semiconductor layer 410a is epitaxially grown on the semiconductor multilayered film 150. This semiconductor layer 410a preferably has the composition mentioned above. Here, the thickness of the semiconductor layer 410a can be formed at $n\lambda/4$ (where n is an integer and $\lambda$ is the oscillation wavelength of the resonator 140 (see FIG. 16)).

Figure 17:
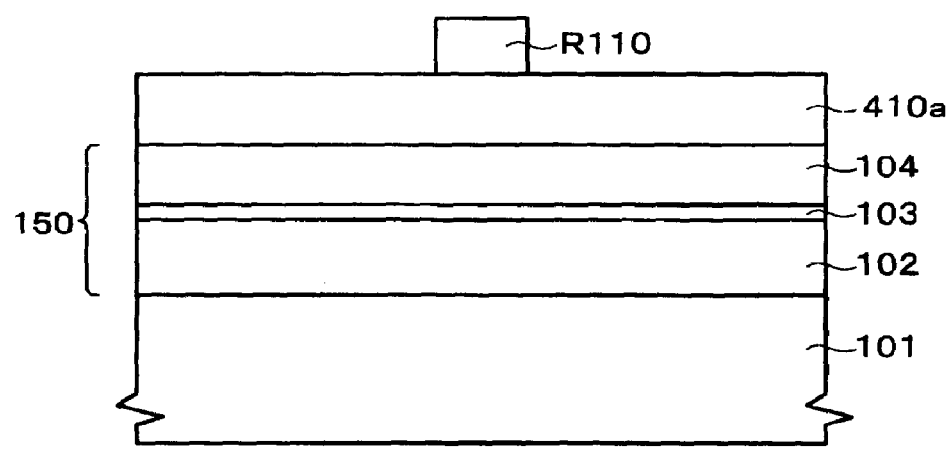
FIG. 17 is a cross-sectional view showing one manufacturing process of the surface-emitting light emitting device shown in FIG. 16.
Figure 18:
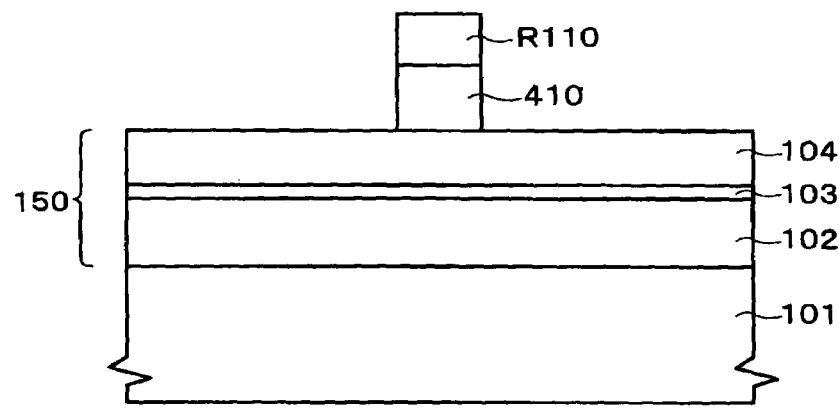
FIG. 18 is a cross-sectional view showing one manufacturing process of the surface-emitting light emitting device shown in FIG. 16.

Then, as shown in FIG. 17, a resist layer R110 of a predetermined pattern is formed on the semiconductor layer 410a. The resist layer R110 is used to form the base member 410 by patterning the semiconductor layer 410a. After this, dry etching, for example, is performed with the resist layer R110 as a mask to pattern the semiconductor layer 410a. By doing so, as shown in FIG. 18, the base member 410 is formed on the semiconductor multilayered film 150. After this, the resist layer R110 is removed.

Figure 19:
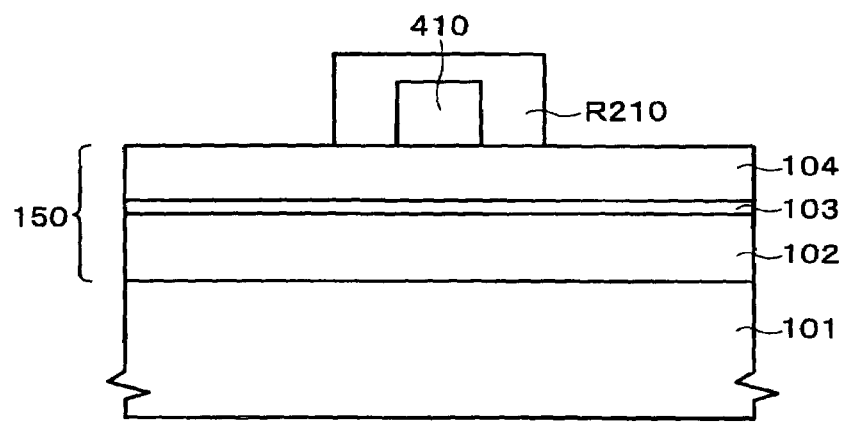
FIG. 19 is a cross-sectional view showing one manufacturing process of the surface-emitting light emitting device shown in FIG. 16.
Figure 20:
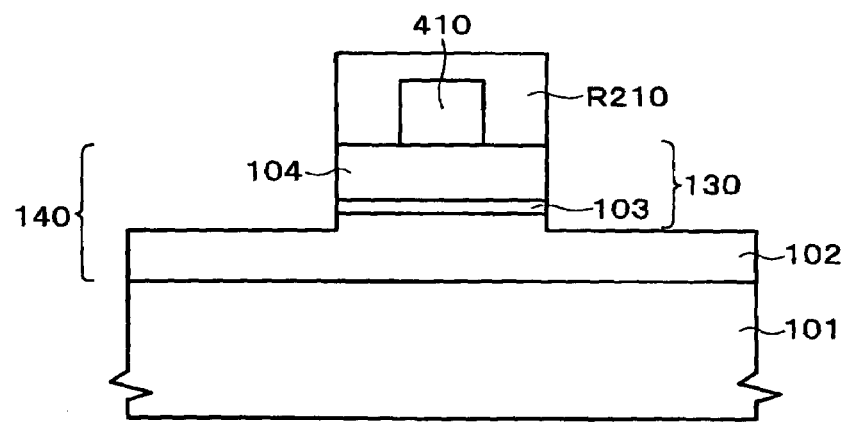
FIG. 20 is a cross-sectional view showing one manufacturing process of the surface-emitting light emitting device shown in FIG. 16.

Next, as shown in FIG. 19, a resist layer R210 with a predetermined pattern is formed on the semiconductor multilayered film 150. The resist layer R210 is used to form the pillar portion 130 by patterning the semiconductor multilayered film 150. After this, dry etching, for example, is performed with the resist layer R210 as a mask to pattern the semiconductor multilayered film 150. Thus, as shown in FIG. 20, the resonator 140 that includes the pillar portion 130 is formed. After this, the resist layer R210 is removed.

Then, after the current aperture 105 has been formed by processes that are the same as the aforementioned processes (3) to (5) in the manufacturing process of the surface-emitting light emitting device 100 of the first exemplary embodiment described above, the insulating layer 106 is formed around the pillar portion 130. Subsequently, the first electrode 107, the second electrodes 109, and the emitting surface 108 are formed (see FIG. 21).

Next, the optical member 111 (see FIG. 16) is formed on the base member 410 by using the same process as the process in (7) described above, out of the manufacturing process of the surface-emitting light emitting device 100 of the first exemplary embodiment described above. Using the above processes, the surface-emitting light emitting device 400 is formed.

While the present exemplary embodiment shows the case where the base member 410 is formed by the first etching and then the pillar portion 130 is formed by the next etching, this order for the etching can be changed as appropriate. That is, after the pillar portion 130 is formed in the first etching, the base member 410 may be formed in the next etching.

4. Function and Effects

The surface-emitting light emitting device 400 according to the present exemplary embodiment and its method of manufacturing have effectively the same function and effects as the surface-emitting light emitting device 100 according to the first exemplary embodiment and its method of manufacturing. In addition, the surface-emitting light emitting device 400 according to the present exemplary embodiment and its method of manufacturing have the function and effects described below.

As regards the surface-emitting light emitting device 400, the semiconductor layer 410a (see FIG. 17) is formed by epitaxial growth. This means that the thickness of the semiconductor layer 410a can be controlled easily. The base member 410 is formed from the semiconductor layer 410a, so that the height of the base member 410 can be controlled easily.

Additionally, since the insulating layer 106 is buried and the electrodes 107 and 109 are formed after the base member 410 has been formed in advance, the effect of the formation of the base member 410 on element characteristics can be reduced.

Fifth Exemplary Embodiment

1. Construction of the Surface-Emitting Light Emitting Device

FIG. 22 is a cross-sectional view showing a model of a surface-emitting light emitting device 500 according to a fifth exemplary embodiment of the present invention. Like the first to fourth exemplary embodiments, this embodiment has been described for the case where an emitting surface-emitting semiconductor laser is used as the surface-emitting light emitting device. Construction elements that are effectively the same as those in the surface-emitting light emitting device 100 according to the first exemplary embodiment have been given the same reference numerals, and detailed description of such has been omitted.

The surface-emitting light emitting device 500 has a construction that differs from the construction of the surface-emitting light emitting device in each of the first to fourth exemplary embodiments in that light is emitted from the rear surface 101b of the semiconductor substrate 101.

In the surface-emitting light emitting device 500, light is emitted from an emitting surface 508 that is provided on the rear surface 101b of the semiconductor substrate 101. In addition, the base member 110 is provided on the emitting surface 508, while the optical member 111 is provided on the upper surface 110a of the base member 110.

An active layer 303 including an InGaAs layer is formed in the surface-emitting light emitting device 500, which differs in construction from the surface-emitting light emitting device in each of the first to fourth exemplary embodiments in which an active layer 103 including an AlGaAs layer is formed. More specifically, the active layer 303 has a quantum well structure including an $In_{0.3}Ga_{0.7}As$ well layer and a GaAs barrier layer.

By providing the active layer 303 including the InGaAs layer, the surface-emitting light emitting device 500 can function as a surface-emitting semiconductor laser that emits light of a wavelength of 880 nm or above (around 1100 nm, for example) that can be transmitted by a GaAs substrate.

2. Operation of the Surface-Emitting Light Emitting Device

The operation of the surface-emitting light emitting device 500 of the present exemplary embodiment is fundamentally the same as that of the surface-emitting light emitting device 100 of the first exemplary embodiment. However, in the surface-emitting light emitting device 500 of the present exemplary embodiment, the emitting surface 508 is provided on the rear surface 101b of the semiconductor substrate 101, so that the light generated by the active layer 303 passes the lower mirror 102 and the semiconductor substrate 101, then is emitted from the emitting surface 508, and thereby enters the base member 110. The laser light that has entered the optical member 111 has its radiation angle adjusted by the optical member 111 and is emitted in a direction (the direction Z shown in FIG. 22) perpendicular to the semiconductor substrate 101.

3. Method of Manufacturing the Surface-Emitting Light Emitting Device

The following describes one example of a method of manufacturing the surface-emitting light emitting device 500 of the fifth exemplary embodiment of the present invention.

Up to a midpoint in the manufacturing process, the surface-emitting light emitting device 500 according to the fifth exemplary embodiment can be formed by using a process that is almost the same as the manufacturing process of the surface-emitting light emitting device 100. More specifically, apart from the formation of the active layer 303 including an $In_{0.3}Ga_{0.7}As$ well layer and a GaAs barrier layer in place of the active layer 103 (see FIG. 3), the different planar forms of the first electrode 107 and the second electrode 109, the formation of the emitting surface 508 on the rear surface 101b, and the mounting of the optical member 111 on the emitting surface 508 via the base member 110, the surface-emitting light emitting device 500 is formed by using almost the same process as the manufacturing process of the surface-emitting light emitting device 100 of the first exemplary embodiment. Therefore, mainly the differences with the manufacturing process of the surface-emitting light emitting device of the first exemplary embodiment are described below.

In the manufacturing process of the surface-emitting light emitting device 500 of the present exemplary embodiment, in forming the second electrode 109, a region where the semiconductor substrate 101 is exposed is provided. The exposed region is the emitting surface 508.

In addition, the base member 110 is formed on the emitting surface 508, and furthermore, the optical member 111 is formed on the upper surface 110a of the base member 110. The method of forming the first electrode 107, the second electrode 109, the base member 110, and the optical member 111 is the same as the method described in the first exemplary embodiment.

4. Function and Effects

The surface-emitting light emitting device 500 of the present exemplary embodiment and its method of manufacturing have effectively the same function and effects as the surface-emitting light emitting device 100 of the first exemplary embodiment and its method of manufacturing.

Sixth Exemplary Embodiment

1. Construction of the Surface-Emitting Light Emitting Device

Figure 23:
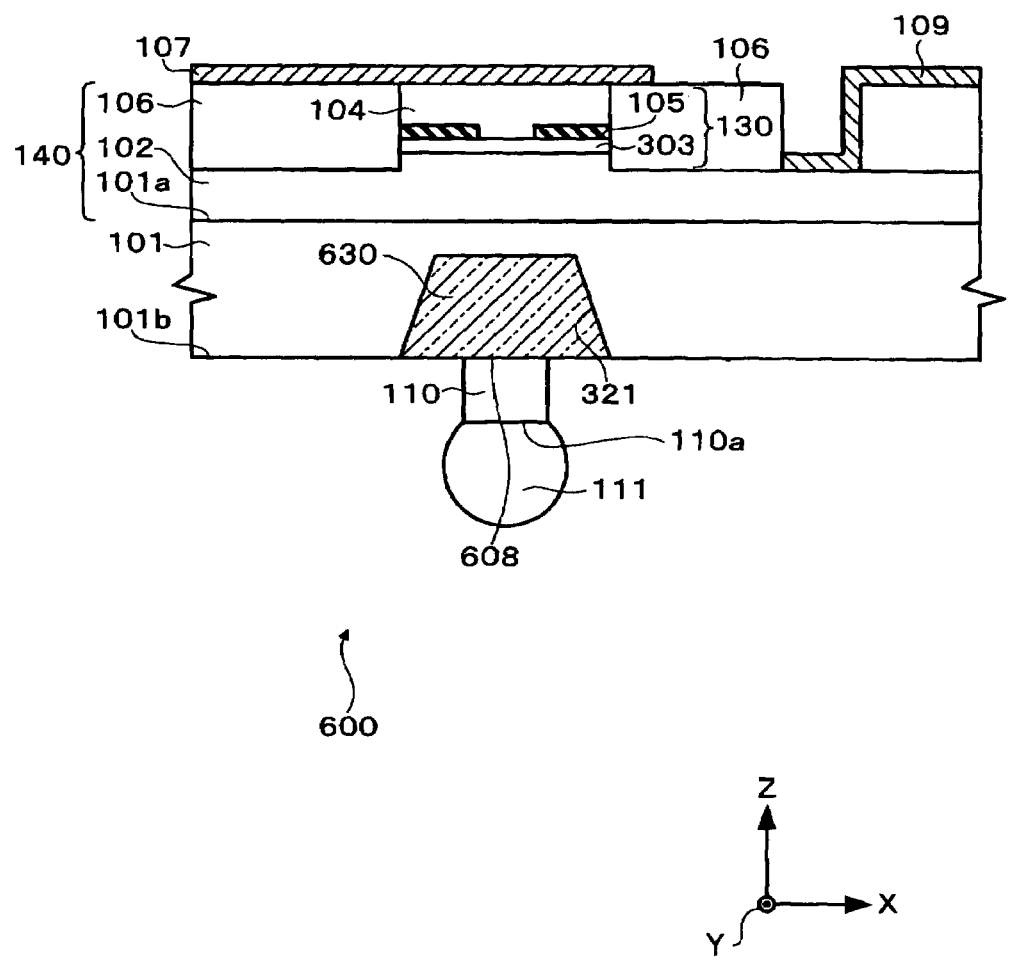
FIG. 23 is a cross-sectional view showing a surface-emitting light emitting device according to the sixth exemplary embodiment of the present invention.

FIG. 23 is a cross-sectional view showing a model of a surface-emitting light emitting device 600 according to a sixth exemplary embodiment of the present invention. Like the first to fifth exemplary embodiments, this embodiment has been described for the case where a emitting surface-emitting semiconductor laser is used as the surface-emitting light emitting device. Construction elements that are effectively the same as those in the surface-emitting light emitting device 100 according to the first exemplary embodiment have been given the same reference numerals, and detailed description of such has been omitted.

The surface-emitting light emitting device 600 of the present exemplary embodiment has a similar construction to the surface-emitting light emitting device 500 of the fifth exemplary embodiment in that light is emitted from the rear surface 101b side of the semiconductor substrate 101. Also like the surface-emitting light emitting device 500 of the fifth exemplary embodiment, the surface-emitting light emitting device 600 has an active layer 303 that includes a quantum well structure composed of an $In_{0.3}Ga_{0.7}As$ well layer and a GaAs barrier layer.

On the other hand, the surface-emitting light emitting device 600 differs from the surface-emitting light emitting device 500 of the fifth exemplary embodiment, in that a concave part 321 is provided on the rear surface 101b of the semiconductor substrate 101 and a light path adjusting layer 630 is buried in the concave part 321, in that the second electrode 109 is formed on the same side as the first electrode 107, and in that the emitting surface 608 is provided on the lower side of the light path adjusting layer 630.

The construction and functions of the other construction elements are approximately the same as the construction and functions of the surface-emitting light emitting device 500 according to the fifth exemplary embodiment. The construction elements that are effectively the same as in the surface-emitting light emitting device 500 according to the fifth exemplary embodiment have been given the same reference numerals, and detailed description of such has been omitted.

More specifically, in the surface-emitting light emitting device 600, the concave part 321 is provided on the rear surface 101b of the semiconductor substrate 101, and moreover, the light path-adjusting layer 630 is buried in this concave part 321. That is, as shown in FIG. 23, the light path-adjusting layer 630 is formed between the semiconductor substrate 101 and the base member 110. The width and thickness of the light path-adjusting layer 630 can be controlled by adjusting the width and depth of the concave part 321. In addition, the light path-adjusting layer 630 is preferably formed of a material that does not absorb the emitted laser light. That is, the material of the light path-adjusting layer 630 is preferably formed of a material that does not have an absorption region in the wavelength region of the laser light emitted from the surface-emitting light emitting device 600.

Also, the base member 110 is formed on the emitting surface 608, and moreover, the optical member 111 is formed on the upper surface 110a of the base member 110.

2. Operation of the Surface-Emitting Light Emitting Device

The operation of the surface-emitting light emitting device 600 of the present exemplary embodiment is fundamentally the same as that of the surface-emitting light emitting device 500. Since the surface-emitting light emitting device 600 of the present exemplary embodiment has the light path adjusting layer 630 formed between the semiconductor substrate 101 and the base member 110, the light that has been generated in the active layer 303 passes the lower mirror 102 and the semiconductor substrate 101, then enters the light path adjusting layer 630, and thereby reaches the emitting surface 608 and is finally emitted from the emitting surface 608. The light to be emitted from the emitting surface 608 is transmitted by the base member 110 and then enters the optical member 111. The light, after having its radiation angle adjusted by the optical member 111, is finally emitted in a direction (the Z direction shown in FIG. 23) perpendicular to the semiconductor substrate 101.

3. Method of Manufacturing the Surface-Emitting Light Emitting Device

With the exception of the formation of the first electrode 107 and the second electrode 109 on the same side, the formation of the concave part 321 on the rear surface 101b of the semiconductor substrate 101, and the formation of the light path adjusting layer 630 in the concave part 321, the surface-emitting light emitting device 600 according to the sixth exemplary embodiment of the present invention is formed by the same manufacturing process as the surface-emitting light emitting device 500 according to the fifth exemplary embodiment. Accordingly, detailed description of such has been omitted.

4. Function and Effects

The surface-emitting light emitting device 600 of the present exemplary embodiment and its method of manufacturing have effectively the same function and effects as the surface-emitting light emitting device 100 of the first exemplary embodiment and its method of manufacturing. In addition, the surface-emitting light emitting device 600 of the present exemplary embodiment and its method of manufacturing have the function and effects described below.

As regards the surface-emitting light emitting device 600 according to the present exemplary embodiment, the light path-adjusting layer 630 is formed between the semiconductor substrate 101 and the base member 110, so that the radiation angle of the emitted light can be controlled with increased versatility. That is, by appropriately selecting a material for forming the light path-adjusting layer 630, it is possible to adjust the refractive index of the light path-adjusting layer 630. Therefore, the radiation angle of the emitted light can be controlled with increased versatility.

Seventh Exemplary Embodiment

1. Construction of the Surface-Emitting Light Emitting Device

Figure 24:
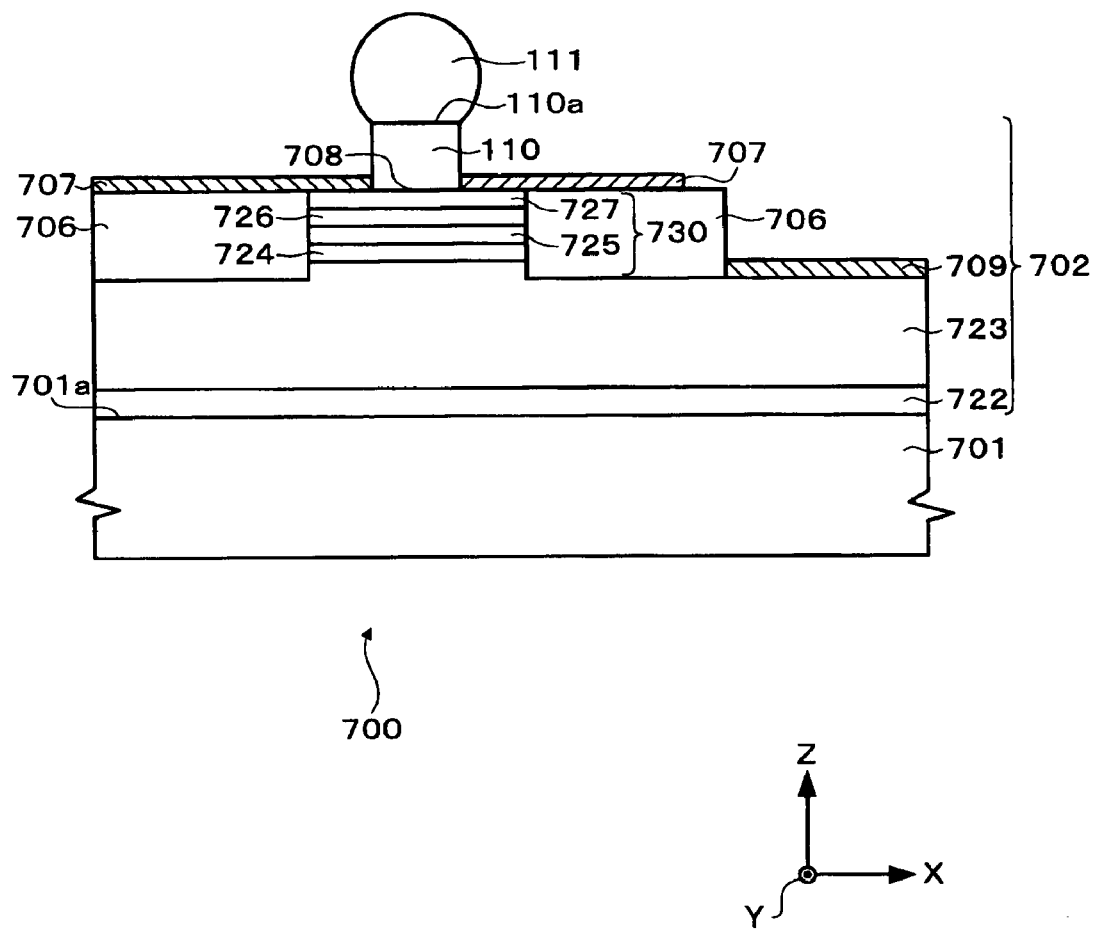
FIG. 24 is a cross-sectional view showing a surface-emitting light emitting device according to the seventh exemplary embodiment of the present invention.
Figure 25:
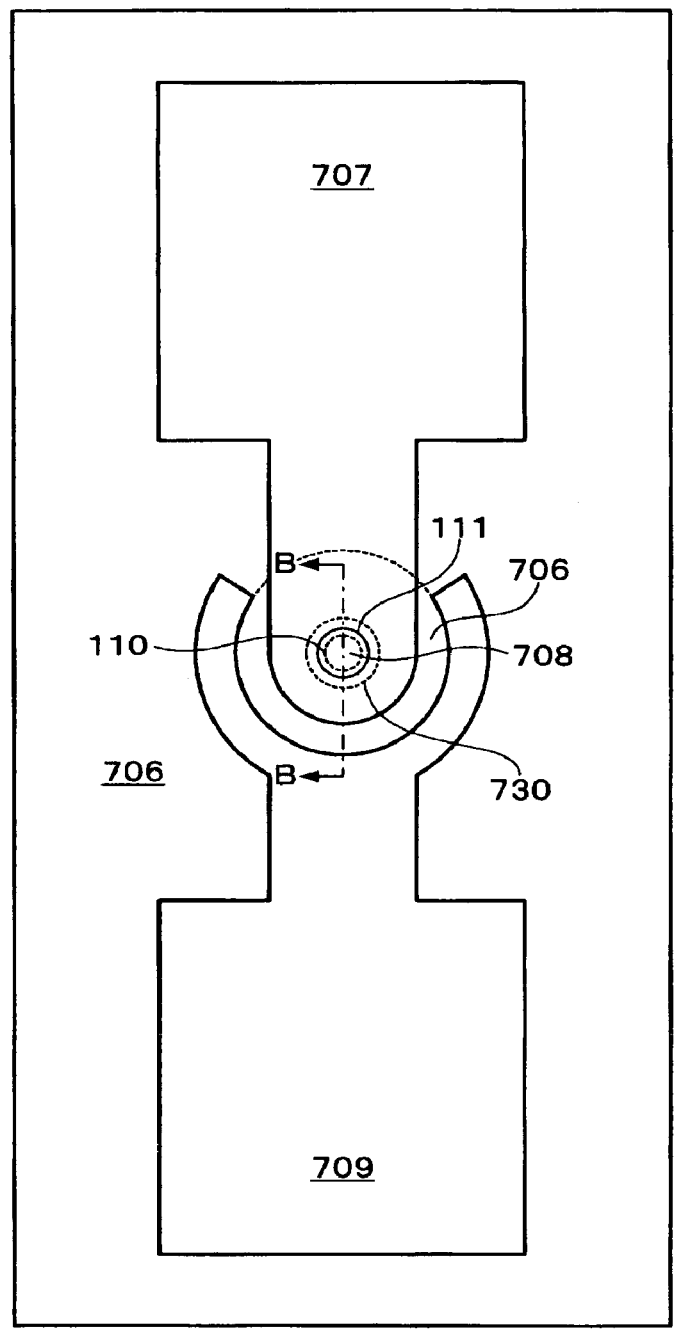
FIG. 25 is a plan view showing a model of the surface-emitting light emitting device according to the seventh exemplary embodiment of the present invention.

FIG. 24 is a cross-sectional view showing a model of a surface-emitting light emitting device 700 according to a seventh exemplary embodiment of the present invention. FIG. 25 is a cross-sectional view taken along the plane B-B in FIG. 24. In the present exemplary embodiment, the case where a semiconductor ultraviolet light emitting diode (hereinafter "UV LED") is used as the surface-emitting light emitting device is described. Construction elements that are effectively the same as those in the surface-emitting light emitting device 100 according to the first exemplary embodiment have been given the same reference numerals, and detailed description of such has been omitted.

As shown in FIG. 24, the surface-emitting light emitting device 700 of the present exemplary embodiment includes a sapphire substrate 701 and a light-emitting element 702 that is formed on the sapphire substrate 701. In the surface-emitting light emitting device 700, UV light is generated by the light-emitting element 702.

As one example, the light emitting element 702 may be constructed of the following layers that are successively deposited on top of one another: a buffer layer 722 composed of an n-type GaN layer formed on the sapphire substrate 701; a contact layer 723 composed of an n-type GaN layer; a cladding layer 724 composed of an n-type AlGaN layer; an active layer 725 that includes at least one GaN layer and functions as the light-emitting layer; a cladding layer 726 composed of a p-type AlGaN layer; and a contact layer 727 composed of a p-type GaN layer.

The contact layer 723 composed of the n-type GaN layer, the active layer 725 that is not doped with an impurity, and the contact layer 727 composed of the p-type GaN layer together form a pin diode.

A part of the light emitting element 702 from the emitting surface 708 side to a point in the contact layer 723 is etched in the form of a circle when looking from the emitting surface 708 side to form a pillar portion 730. In the present exemplary embodiment, the pillar portion 730 refers to semiconductor sediment in the shape of a pillar that forms part of the light emitting element 702. Here, the planar form of the pillar portion 730 may be any freely chosen shape.

An insulating layer 706 is formed so as to cover the side surface of the pillar portion 730 and the upper surface of the contact layer 723. Accordingly, the side surface of the pillar portion 730 is surrounded by the insulating layer 706.

In addition, a first electrode 707 is formed from the upper surface of the pillar portion 730 and extends over the surface of the insulating layer 706. The emitting surface 708 is provided on the upper surface of the pillar portion 730, with light being emitted from the emitting surface 708. That is, the part of the upper surface of the pillar portion 730 that is not covered by the first electrode 707 corresponds to the emitting surface 708. Also, part of the insulating layer 706 is removed to expose the contact layer 723, and thereby the second electrode 709 is formed so as to contact the exposed surface of the contact layer 723.

The insulating layer 706, the first electrode 707, and the second electrode 709 can be formed by using the same materials as the insulating layer 106 and the first electrode 107, and the second electrode 109, respectively, that compose the surface-emitting light emitting device of the first to sixth exemplary embodiments described above.

In the surface-emitting light emitting device 700 of the present exemplary embodiment, the base member 110 is formed on the emitting surface 708, and moreover, the optical member 111 is formed on the upper surface 110a of the base member 110.

2. Operation of the Surface-Emitting Light Emitting Device

The following describes the normal operation of the surface-emitting light emitting device 700 of the present exemplary embodiment. The following is one example of a driving method for a UV LED, and therefore a variety of modifications can be made without departing from the gist of the present invention.

First, when a voltage in the forward direction is applied to the pin diode at the first electrode 707 and the second electrode 709, the recombining of electrons and holes occurs in the active layer 725, with such recombining resulting in the emission of light (UV light). After this UV light has been emitted from the emitting surface 708 that is the upper surface of the pillar portion 730, the UV light enters the base member 110. The light that has entered the base member 110 is then transmitted by the base member 110, and thereby enters the optical member 111. After the radiation angle has been adjusted by the optical member 111, the light is finally emitted in a direction (the direction Z shown in FIG. 24) perpendicular to the semiconductor substrate 101.

3. Method of Manufacturing the Surface-Emitting Light Emitting Device

The following describes one example of a method of manufacturing the surface-emitting light emitting device 700 of the seventh exemplary embodiment of the present invention. The surface-emitting light emitting device 700 can be formed by a process that resembles the process of forming the surface-emitting light emitting device 100 of the first exemplary embodiment.

(1) First, a multilayered film (not shown in the drawing) composed of the buffer layer 722 composed of an n-type GaN layer, the contact layer 723 composed of an n-type GaN layer; the cladding layer 724 composed of an n-type AlGaN layer; the active layer 725 that includes at least one GaN layer and functions as the light-emitting layer; the cladding layer 726 composed of a p-type AlGaN layer; and the contact layer 727 composed of a p-type GaN layer is formed by crystal growth on the surface of the sapphire substrate 701. MOVCD and MBE are examples of the method used for crystal growth. At this point, doping with silicon, for example, may be performed when an n-type layer is formed, while doping with magnesium, for example, may be performed when a p-type layer is formed. Alternatively, doping with germanium, for example, may be performed when an n-type layer is formed, while doping with zinc, for example, may be performed when a p-type layer is formed. Also, the well-known technique disclosed in Japanese Unexamined Patent Application Publication No. H04-297023, for example, may be used for the crystal growth.

Next, an annealing process is performed. Then, after the magnesium included in each of the cladding layer 726 and the contact layer 727 has been activated, etching, such as dry etching, is performed from the p-type contact layer 727 to a point in the n-type contact layer 723, and thereby form the pillar portion 730.

(2) Next, the insulating layer 706 is formed around the pillar portion 730. The insulating layer 706 can be formed by using the same process as the insulating layer 106 of the first exemplary embodiment. In this process, in order to form the second electrode 709 on the contact layer 723, the insulating layer 706 is formed in a shape that exposes part of the contact layer 723.

(3) Next, the first electrode 707 and the second electrode 709 are formed by vacuum deposition, for example. In this process, the emitting surface 708 is formed on an upper surface of the pillar portion 730. Also in this process, a desired surface shape can be obtained by using a lift-off method. Alternatively, the first electrode 707 and the second electrode 709 may be formed by using dry etching. After these electrodes have been formed, an annealing process is performed to form ohmic contact.

(4) Then, after the base member 110 has been formed on the emitting surface 708, the optical member 111 is formed on the upper surface 110a of the base member 110. The base member 110 and the optical member 111 can be manufactured by using the same method as that described in the manufacturing process of the surface-emitting light emitting device 100 of the first exemplary embodiment described above. Alternatively, the base member 110 may be integrally formed with the pillar portion 730, in the same way as the base member 410 (see FIG. 16) of the surface-emitting light emitting device 400 of the fourth exemplary embodiment described above. Thus the above processes form the surface-emitting light emitting device 700 shown in FIG. 24 and FIG. 25.

4. Function and Effects

The surface-emitting light emitting device 700 of the present exemplary embodiment and its method of manufacturing have effectively the same function and effects as the surface-emitting light emitting device 100 of the first exemplary embodiment and its method of manufacturing.

Eighth Exemplary Embodiment

1. Construction of the Surface-Emitting Light Emitting Device

Figure 26:
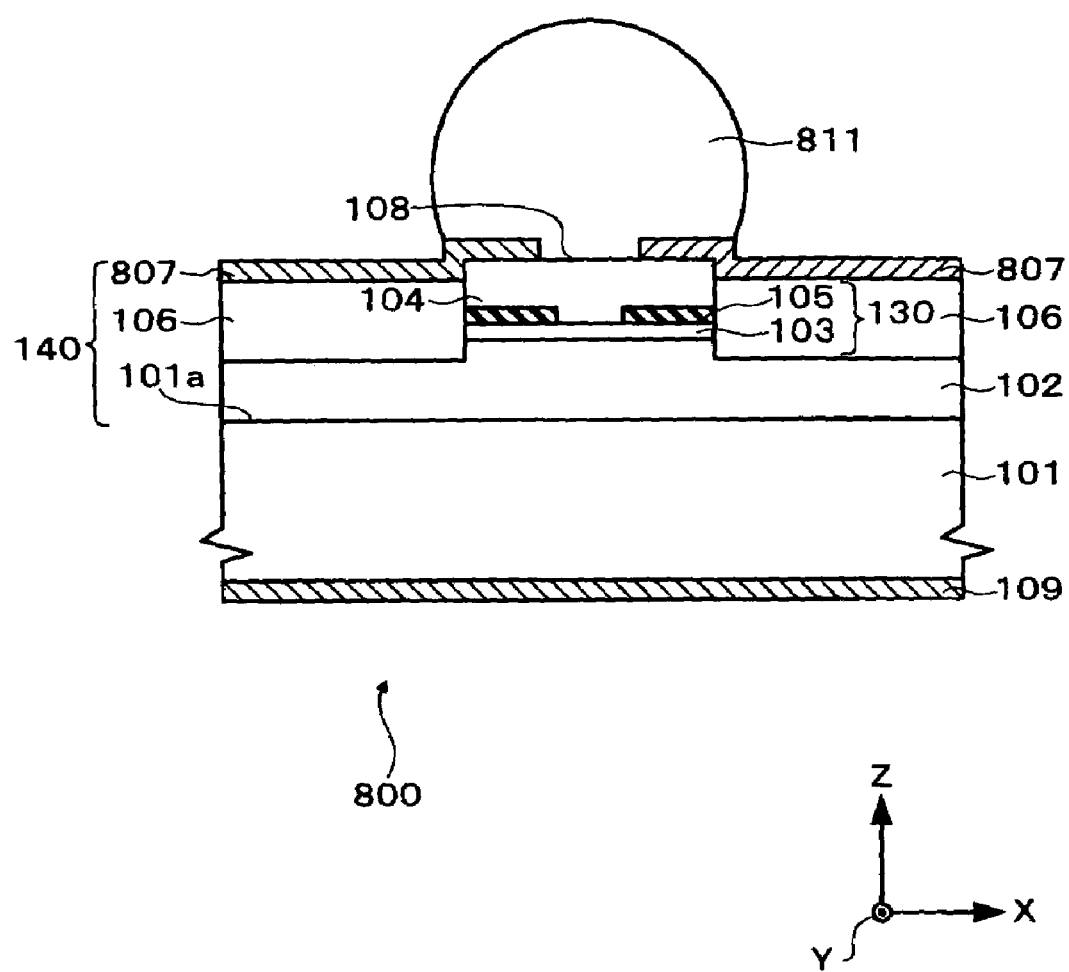
FIG. 26 is a cross-sectional view showing a model of a surface-emitting light emitting device according to the eighth exemplary embodiment of the present invention.

FIG. 26 is a cross-sectional view showing a model of a surface-emitting light emitting device 800 according to an eighth exemplary embodiment of the present invention. Like the first exemplary embodiment, this embodiment has been described for the case where a surface-emitting semiconductor laser is used as the surface-emitting light emitting device.

Apart from the pillar portion 130 having a function as a base member, the surface-emitting light emitting device 800 has almost the same construction as the surface-emitting light emitting device 100 according to the first exemplary embodiment. For this reason, construction elements that are effectively the same as in the surface-emitting light emitting device 100 of the first exemplary embodiment have been given the same reference numerals, and detailed description of such has been omitted.

As shown in FIG. 26, in the surface-emitting light emitting device 800, the pillar portion 130 has a function as a base member. More specifically, the optical member 811 is formed on the pillar portion 130 via the first electrode 807. Furthermore, the upper surface of the insulating layer 106 is provided at a lower position than the upper surface of the pillar portion 130, and the first electrode 807 is formed with its thickness approximately equal over the pillar portion 130 and the insulating layer 106. By doing so, the pillar portion 130 can be provided with a function as a base member.

The construction, material, and functions of the optical member 811 are the same as the construction, material, and functions of the optical member 111 of the first embodiment.

2. Operation of the Surface-Emitting Light Emitting Device

The operation of the surface-emitting light emitting device 800 of the present exemplary embodiment is fundamentally the same as that of the surface-emitting light emitting device 100 of the first exemplary embodiment, and so detailed description of such has been omitted.

3. Method of Manufacturing the Surface-Emitting Light Emitting Device

With the exception of the formation of the optical member 811 on the upper surface of the pillar portion 130, the method of manufacturing the surface-emitting light emitting device 800 according to the present exemplary embodiment is the same as the method of manufacturing the surface-emitting light emitting device 100 according to the first exemplary embodiment. Here, the optical member 811 can be formed on the upper surface of the pillar portion 130 by using the pillar portion 130 as a base member according to the same method as the optical member 111 of the first exemplary embodiment. Detailed description of the other processes has been omitted.

4. Function and Effects

The surface-emitting light emitting device 800 according to the present exemplary embodiment and its method of manufacturing have effectively the same function and effects as the surface-emitting light emitting device 100 according to the first exemplary embodiment and its method of manufacturing. In addition, the surface-emitting light emitting device 800 according to the present exemplary embodiment and its method of manufacturing have the function and effects described below.

The optical member 811 is formed by using the pillar portion 130 as a base member. By doing so, there is no need to separately form a base member. This makes it possible to simplify the manufacturing process.

Ninth Exemplary Embodiment

Figure 27:
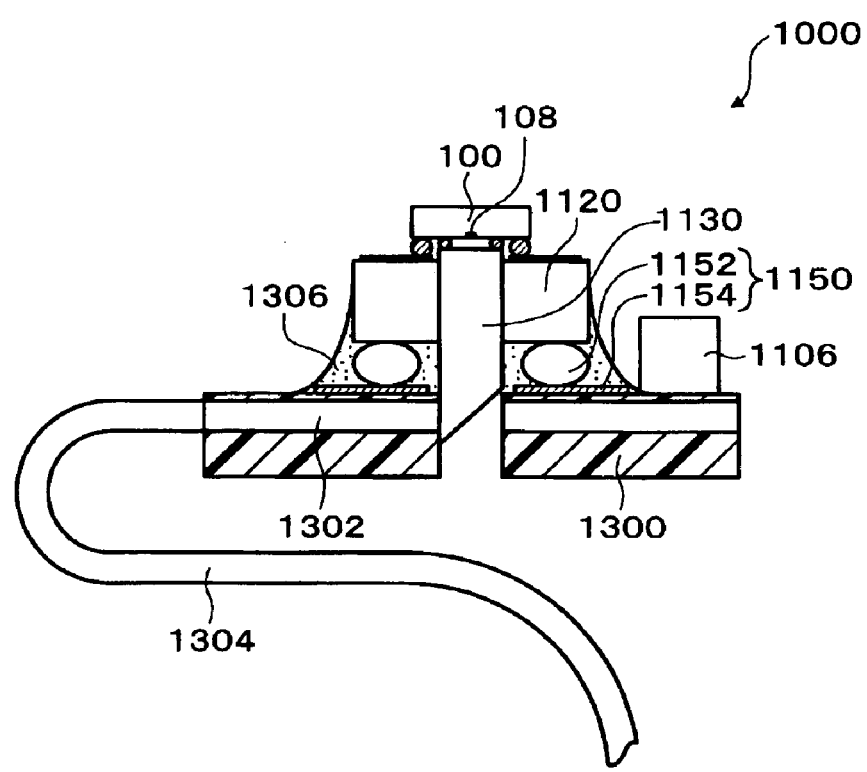
FIG. 27 shows a model of an optical module according to the ninth exemplary embodiment of the present invention.

FIG. 27 is a cross-sectional view showing a model of an optical module according to a ninth exemplary embodiment of the present invention. The optical module according to the present exemplary embodiment includes a structural body 1000 (see FIG. 27). The structural body 1000 includes the surface-emitting light emitting device 100 according to the first exemplary embodiment (see FIG. 1), a platform 1120, a first optical wave-guide 1130, and an actuator 1150. The structural body 1000 also includes a second optical wave-guide 1302. The second optical wave-guide 1302 forms part of a substrate 1300. This second optical wave-guide 1302 may be optically connected to a connecting optical wave-guide 1304. The connecting optical wave-guide 1304 may be an optical fiber. The platform 1120 is fixed to the substrate 1300 by a resin 1306.

In the optical module of the present exemplary embodiment, after light is emitted from the surface-emitting light emitting device 100 (the emitting surface 108: see FIG. 1), the light passes the first optical wave-guide 1130 and the second optical wave-guide 1302 (and the connecting optical wave-guide 1304), and then the light is received by a light receiving element (not shown in the drawing).

Tenth Exemplary Embodiment

Figure 28:
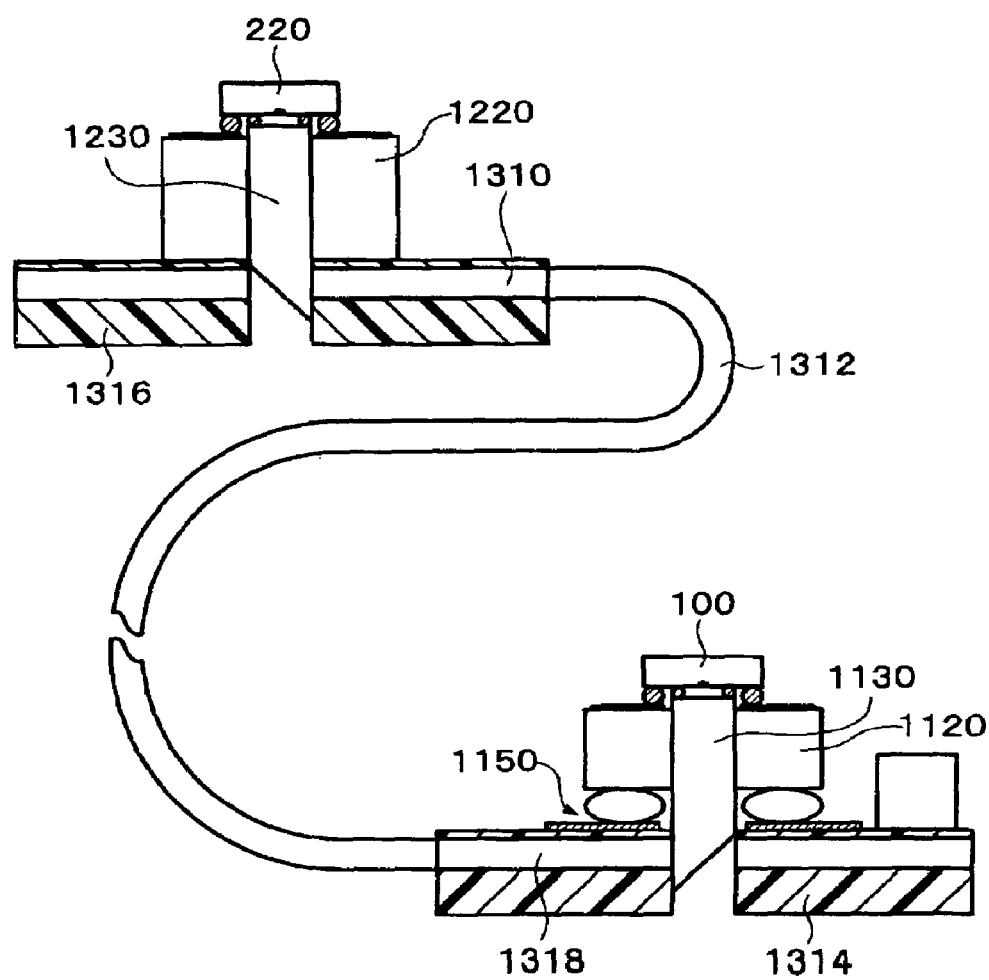
FIG. 28 shows an optical transmission apparatus according to the tenth exemplary embodiment of the present invention.

FIG. 28 shows an optical transmission apparatus according to a tenth exemplary embodiment of the present invention. In the present exemplary embodiment, a plurality of third optical wave-guides 1230, 1310, and 1312 are provided between the first optical wave-guide 1130 and the light-receiving element 220. The optical transmission apparatus according to the present exemplary embodiment also has a plurality (two) of substrates 1314 and 1316.

In the present exemplary embodiment, the third optical wave-guide 1312 is provided between the construction on the surface-emitting light emitting device 100 side (including the surface-emitting light emitting device 100, the platform 1120, the first optical wave-guide 1130, the second optical wave-guide 1318, and the actuator 1150) and the construction on the light receiving element 220 side (including the light receiving element 220, the platform 1220, and the third optical wave-guide 1230, and the third optical wave-guide 1310). Optical fiber or the like is used as the third optical wave-guide 1312, so that optical transmission can be performed between a plurality of electronic appliance.

Figure 29:
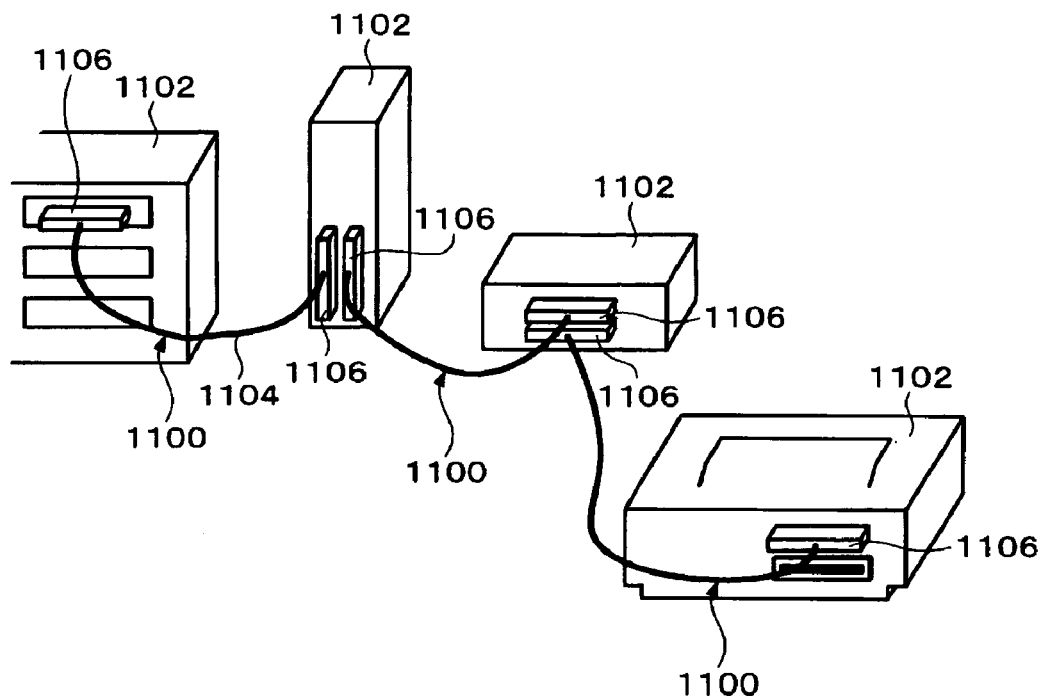
FIG. 29 shows an optical transmission apparatus according to the tenth exemplary embodiment of the present invention.

As one example, in FIG. 29, the optical transmission apparatus 1100 connects electronic appliances 1102 such as a computer, a display, a storage apparatus, and a printer together. The electronic appliances 1102 may be information communication appliances. The optical transmission apparatus 1100 includes a cable 1104 that includes the third optical wave-guide 1312, such as an optical fiber. The optical transmission apparatus 1100 may be provided with plugs 1106 at both ends of the cable 1104. The structures of surface-emitting light emitting device 100 side and the light receiving element 220 side are provided inside each of the plugs 1106. Electric signals output from any of the electronic appliances 1102 are converted into optical signals by the light emitting device, the optical signals are transmitted by the cable 1104 and then converted back into electric signals by the light receiving element. The electric signals are input into another electronic appliance 1102. By doing so, information is transmitted between the electronic appliances 1102 through the optical signals by the optical transmission apparatus 1100 according to the present exemplary embodiment.

Figure 30:
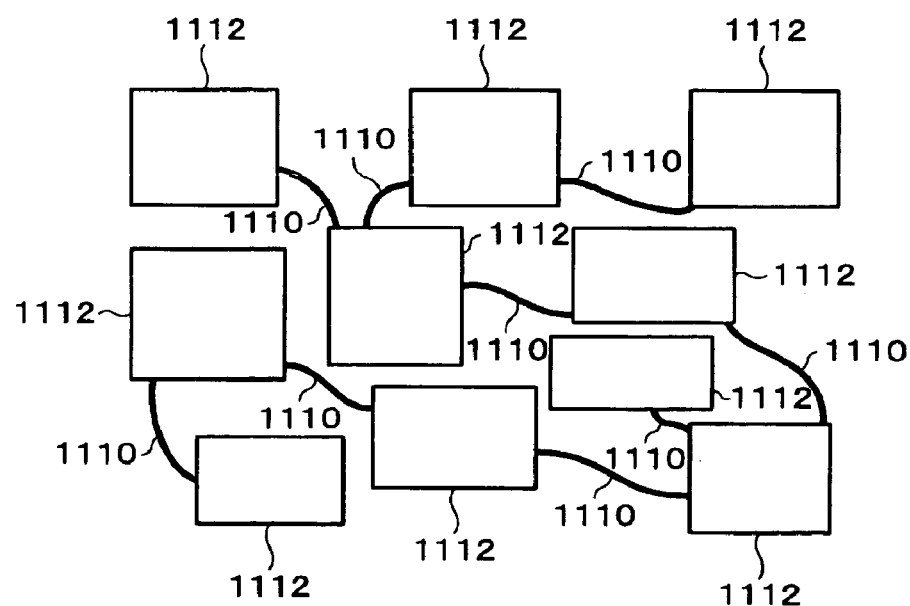
FIG. 30 shows an application of the optical transmission apparatus according to the tenth exemplary embodiment of the present invention.

FIG. 30 shows an example application of the optical transmission apparatus of the present exemplary embodiment of the present invention. The optical transmission apparatus 1112 connects electronic appliances 1110. These electronic appliances 1110 may be liquid crystal monitors or digital CRTs (used in the fields of finance, mail-order, medicine, and education), liquid crystal projectors, plasma display panels (PDP), digital TVs, retail cash registers (for POS (Point of Sale Scanning)), video decks, tuners, game apparatuses, printers, etc.

The eighth to tenth exemplary embodiments (see FIG. 27 to FIG. 30) can also achieve the same function and effects when the surface-emitting light emitting device 190 (see FIG. 12), 180 (see FIG. 13), 200 (see FIG. 14), 300 (see FIG. 15), 400 (see FIG. 16), 500 (see FIG. 22), 600 (see FIG. 23), 700 (see FIG. 24), or 800 (see FIG. 26) is used in place of the surface-emitting light emitting device 100.

That is, the present invention is not limited to the exemplary embodiments described above, and can be modified in a variety of ways. As one example, the present invention includes constructions (for example, constructions that have the same functions, methods, and results, or constructions that have the same object and results) that are effectively the same as the constructions described in the exemplary embodiments. The present invention also includes constructions in which the non-essential parts of constructions described in the exemplary embodiments have been replaced. The present invention also includes constructions that have the same function and effects and constructions that can achieve the same object as the constructions described in the exemplary embodiments. The present invention also includes constructions in which well-known techniques have been applied to the constructions described in the exemplary embodiments.

As one example, while the surface-emitting light emitting device with one pillar portion are described in each of the above exemplary embodiments, the aspects of the present invention can be maintained even if a plurality of pillar portions are provided in the substrate surface. The same function and effects are also obtained when a plurality of surface-emitting light emitting devices are arranged in an array.

Also, for example, in the above embodiments, the p-type and n-type semiconductor layers can be interchanged without departing from the gist of the present invention. In the above exemplary embodiments, AlGaAs materials were described, though depending on the oscillation wavelength, other materials such as GaInP, ZnSSe, InGaN, AlGaN, InGaAs, GaInNAs, and GaAsSb semiconductor materials can be also used.

What is claimed is:

1. A surface-emitting light emitting device capable of emitting light in a direction perpendicular to a substrate, comprising:
   an emitting surface that emits the light;
   a base member that is provided on the emitting surface, the base member being made of resin;
   an optical member that is provided on an upper surface of the base member, the optical member having a maximum cross section and a lower surface, the maximum cross section being parallel with the lower surface, the lower surface being in contact with the upper surface of the base member, the maximum cross section being at a distance from the upper surface of the base member, a width of the maximum cross section being larger than a width of the lower surface;
   the surface-emitting light emitting device being a surface-emitting semiconductor laser;
   the substrate being a semiconductor substrate;
   the surface-emitting semiconductor laser being formed on the semiconductor substrate, including a resonator having a pillar portion, and the emitting surface provided on a top surface of the pillar portion; and
   a diameter of a bottom surface of the base member being smaller than a diameter of the top surface of the pillar portion.

2. The surface-emitting light emitting device according to claim 1,
   the base member being made of a material that transmits light of a predetermined wavelength.

3. The surface-emitting light emitting device according to claim 1,
   the optical member functioning as a lens.

4. The surface-emitting light emitting device according to claim 1,
   the optical member functioning as a polarizer.

5. The surface-emitting light emitting device according to claim 1,
   the optical member being in the shape of a sphere or an oval sphere.

6. The surface-emitting light emitting device according to any of claim 1,
   a sealing member being formed so as to cover at least part of the optical member.

7. The surface-emitting light emitting device according to claim 1,
   the upper surface of the base member being a curved surface.

8. The surface-emitting light emitting device according to claim 1,
   an angle made between the upper surface of the base member and a surface on a side part of the base member that contacts the upper surface being an acute angle.

9. The surface-emitting light emitting device according to claim 1,
   the substrate being a semiconductor substrate;
   the surface-emitting semiconductor laser including a resonator formed on the semiconductor substrate; and
   the emitting surface being provided on a rear surface of the semiconductor substrate.

10. The surface-emitting light emitting device according to claim 1,
    the substrate being a semiconductor substrate;
    the surface-emitting semiconductor laser including a resonator formed on the semiconductor substrate;
    a concave part being formed in a rear surface of the semiconductor substrate;
    a light path adjusting layer being formed by being buried in the concave part; and
    the emitting surface being provided on an upper surface of the light path adjusting layer.

11. The surface-emitting light emitting device according to claim 1,
    the optical member functioning as a lens and being in the form of a truncated sphere;
    a refractive index of the optical member being approximately equal to a refractive index of the base member;
    a radius of curvature "r" of the optical member and a distance "d" from the emitting surface to a highest point of the optical member satisfies, $r \leq 0.34 * d.$ 12. An optical module, comprising:
    the surface-emitting light emitting device according to claim 1, and an optical wave-guide.

13. An optical transmission apparatus, comprising:
    the optical module according to claim 12.

14. The surface-emitting light emitting device according to any of claim 1,
    the optical member being formed over an entire top surface of the base member.

15. The surface-emitting light emitting device according to claim 1, a height of the base member being shorter than a height of the optical member.

16. A surface-emitting light emitting device capable of emitting light in a direction perpendicular to a substrate, comprising:
    an emitting surface that emits the light;
    a base member that is provided on the emitting surface, the base member being made of resin;
    an optical member that is provided on an upper surface of the base member, the optical member having a maximum cross section and a lower surface, the maximum cross section being parallel with the lower surface, the lower surface being in contact with the upper surface of the base member, the maximum cross section being at a distance from the upper surface of the base member, a width of the maximum cross section being larger than a width of the lower surface;
    the substrate being a semiconductor substrate;
    the semiconductor light emitting diode including a light emitting element that is formed on the semiconductor substrate, and a pillar portion that includes an active layer that forms at least part of the light emitting element;

the emitting surface is provided on a top surface of the pillar portion; and a diameter of a bottom surface of the base member being smaller than a diameter of the top surface of the pillar portion.

17. The surface-emitting light emitting device according to claim 1, the base member being formed integrally with the pillar portion.

18. The surface-emitting light emitting device according to claim 17, the base member being composed of a semiconductor layer.

19. The surface-emitting light emitting device according to claim 16, a height of the base member being shorter than a height of the optical member.

20. A method of manufacturing a surface-emitting light emitting device capable of emitting light in a direction perpendicular to a substrate, comprising:

(a) forming a part that has an emitting surface and functions as the light emitting element;

(b) forming a base member on the substrate, the base member being made of resin;

(c) discharging a droplet onto an upper surface of the base member to form an optical member precursor;

(d) hardening the optical member precursor to form an optical member;

the surface-emitting light emitting device being a surface-emitting semiconductor laser;

the substrate being a semiconductor substrate;

the optical member having a maximum cross section and a lower surface, the maximum cross section being parallel with the lower surface, the lower surface being in contact with the upper surface of the base member, the maximum cross section being at a distance from the upper surface of the base member, a width of the maximum cross section being larger than a width of the lower surface;

the surface-emitting semiconductor laser being formed on the semiconductor substrate, includes a resonator having a pillar portion, and the emitting surface provided on a top surface of the pillar portion; and a diameter of a bottom surface of the base member being smaller than a diameter of the top surface of the pillar portion.

21. The method of manufacturing the surface-emitting light emitting device according to claim 20, the droplet being discharged by using an ink jet method in step (c).

22. The method of manufacturing a surface-emitting light emitting device according to claim 20, further comprising:

(e) adjusting wettability of the upper surface of the base member with respect to the droplet before (c).

23. The method of manufacturing a surface-emitting light emitting device according to claim 20, the optical member being formed over an entire top surface of the base member.

24. The method according to claim 20, a height of the base member being shorter than a height of the optical member.

* * * * *